US007620138B2

(12) United States Patent
Muta

(10) Patent No.: US 7,620,138 B2
(45) Date of Patent: Nov. 17, 2009

(54) APPARATUS FOR RECEIVING PARALLEL DATA AND METHOD THEREOF

(75) Inventor: Toshiyuki Muta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 552 days.

(21) Appl. No.: 10/997,950

(22) Filed: Nov. 29, 2004

(65) Prior Publication Data

US 2006/0002399 A1 Jan. 5, 2006

(30) Foreign Application Priority Data

Jun. 30, 2004 (JP) ............................. 2004-192626

(51) Int. Cl.
  *H04L 7/00* (2006.01)
(52) U.S. Cl. ..................... 375/372; 375/295; 375/316; 375/340
(58) Field of Classification Search ................ 375/372, 375/371
  See application file for complete search history.

(56) References Cited

U.S. PATENT DOCUMENTS

| 5,621,774 | A | 4/1997 | Ishibashi et al. | |
|---|---|---|---|---|
| 6,078,623 | A | 6/2000 | Isobe et al. | |
| 6,247,138 | B1 | 6/2001 | Tamura et al. | |
| 6,279,077 | B1 * | 8/2001 | Nasserbakht et al. | 711/118 |
| 6,373,278 | B1 * | 4/2002 | Sung et al. | 326/38 |
| 6,484,268 | B2 | 11/2002 | Tamura et al. | |
| 6,603,466 | B1 * | 8/2003 | Sakaguchi et al. | 345/204 |
| 6,636,993 | B1 | 10/2003 | Koyanagi et al. | |
| 6,744,837 | B1 * | 6/2004 | Satou et al. | 375/372 |
| 6,911,843 | B2 * | 6/2005 | Mizumoto et al. | 326/86 |
| 6,928,126 | B2 * | 8/2005 | Ono et al. | 375/359 |
| 6,968,025 | B2 * | 11/2005 | Tanahashi | 375/355 |
| 7,061,938 | B2 * | 6/2006 | Hogeboom | 370/503 |
| 7,085,950 | B2 * | 8/2006 | Ehmann et al. | 713/503 |
| 7,187,741 | B2 * | 3/2007 | Pontius et al. | 375/372 |
| 7,272,200 | B2 * | 9/2007 | Nishimura et al. | 375/354 |
| 7,415,404 | B2 * | 8/2008 | Harrison | 703/13 |
| 7,460,630 | B2 * | 12/2008 | Kato et al. | 375/372 |
| 2001/0014922 | A1 | 8/2001 | Kuge | |

(Continued)

FOREIGN PATENT DOCUMENTS

JP         05-075594         3/1993

(Continued)

OTHER PUBLICATIONS

Horowitz, "The Art of Electronics, Passage", Sequential Functions Available As ICs, 1989, p. 541.

(Continued)

*Primary Examiner*—Shuwang Liu
*Assistant Examiner*—Kenneth Lam
(74) *Attorney, Agent, or Firm*—Staas & Halsey LLP

(57) ABSTRACT

A data reception apparatus adjusts a first clock signal and fetches the data signal in a data buffer, using a data signal in accordance with the adjustment clock signal in such a way that a set-up time and a hold time of the data signal are secured for each bit or for each group of parallel data. Then, this apparatus selects the data of a plurality of bits in the data buffer in chronological order and reads out the selected data as parallel data, in accordance with a second clock signal.

13 Claims, 18 Drawing Sheets

U.S. PATENT DOCUMENTS

| | | | |
|---|---|---|---|
| 2002/0009169 A1 | 1/2002 | Watanabe | |
| 2003/0046618 A1* | 3/2003 | Collins | 714/700 |
| 2003/0081713 A1 | 5/2003 | Pontius et al. | |
| 2003/0194037 A1 | 10/2003 | Ono et al. | |
| 2004/0091073 A1* | 5/2004 | Smith et al. | 375/355 |

FOREIGN PATENT DOCUMENTS

| | | |
|---|---|---|
| JP | 6-53955 | 2/1994 |
| JP | 11-275066 | 10/1999 |
| JP | 2000-261297 | 9/2000 |
| JP | 2002-223208 | 8/2002 |
| KR | 2001-0024842 | 3/2001 |
| WO | WO96/29655 | 9/1996 |

OTHER PUBLICATIONS

Office Action for Korean Patent Publication No. 2001-24842 dated May 12, 2006.

Communication from the Chinese Patent Office issued on Dec. 26, 2008 in the corresponding Chinese patent application No. 200510068099.X.

* cited by examiner

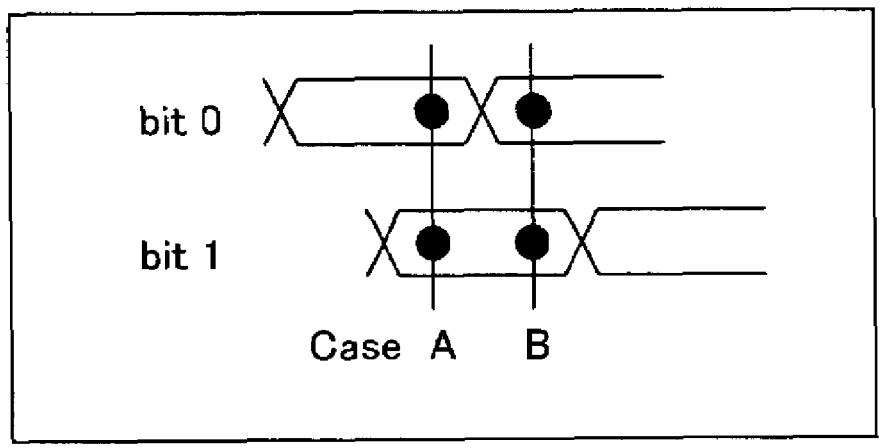
F I G. 1

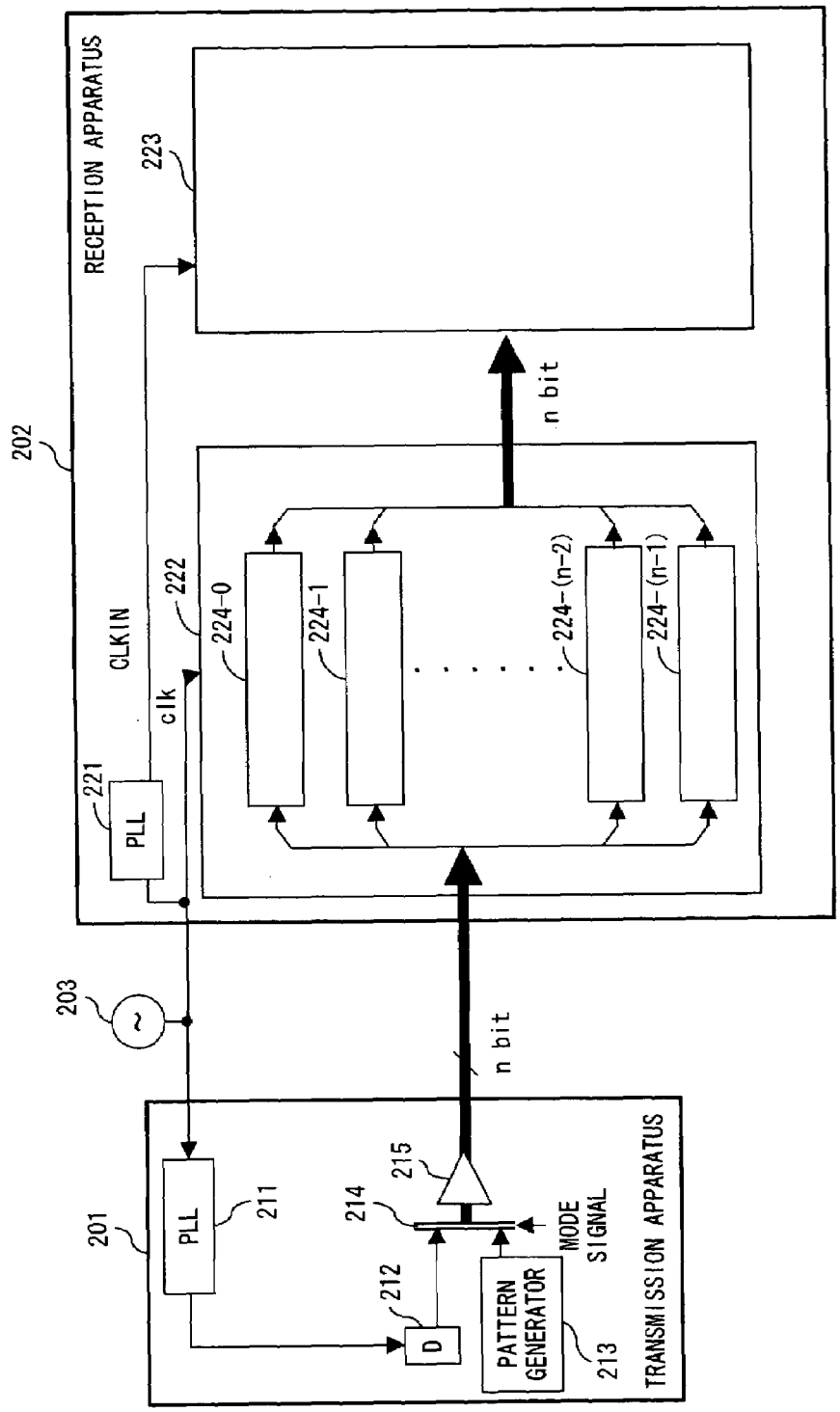
F I G. 2 B

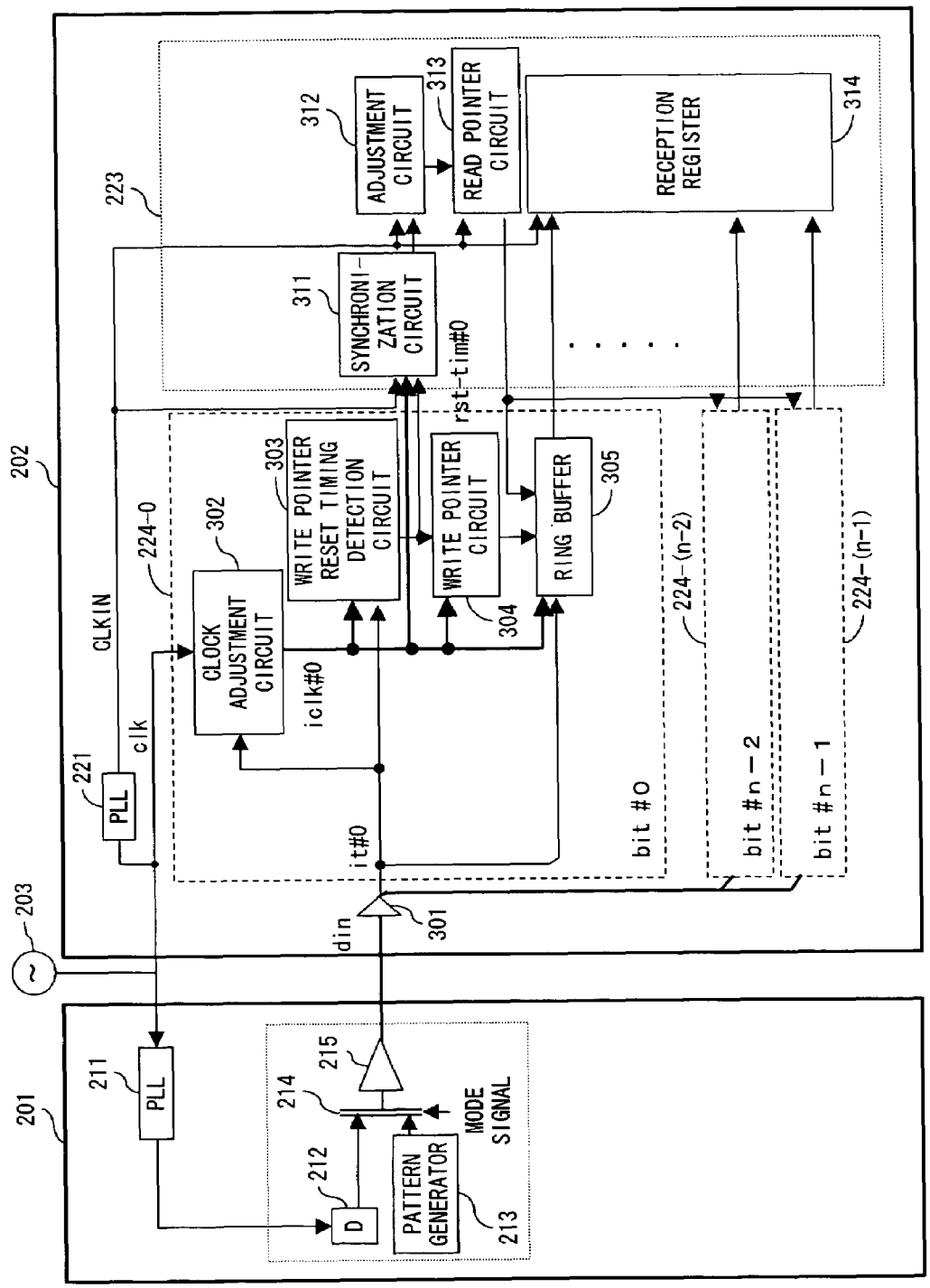
F I G. 3

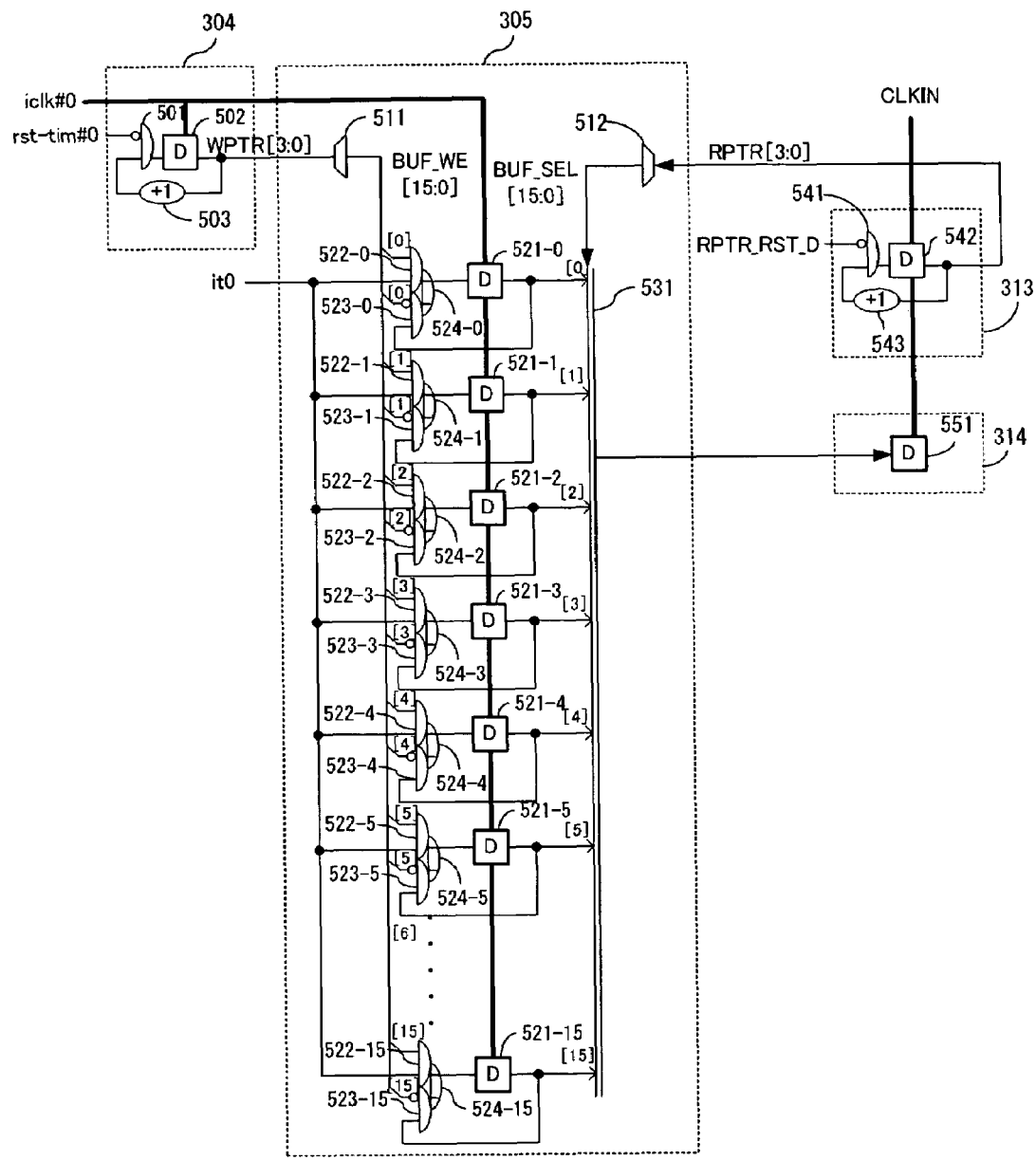
F I G. 5

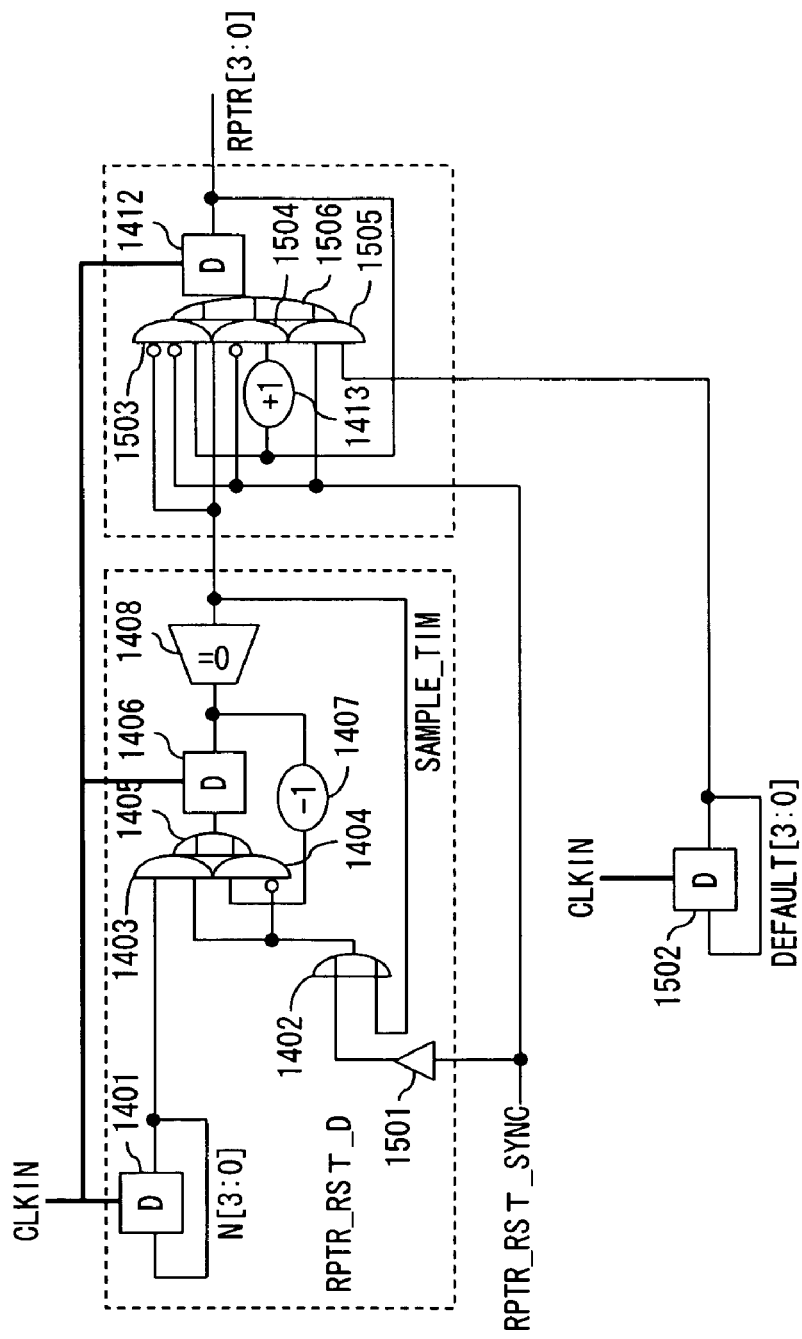
F I G. 15

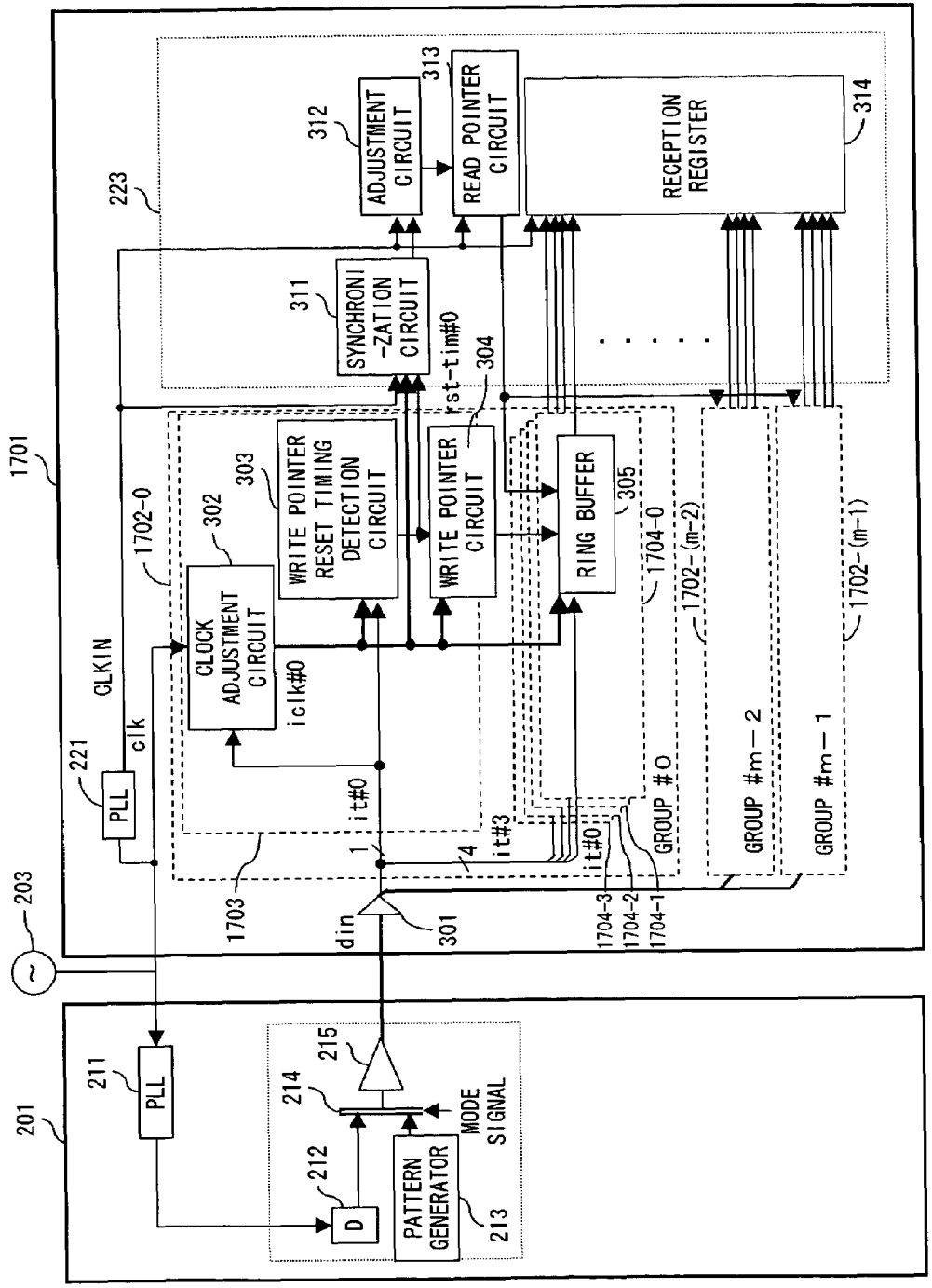
F I G. 17

APPARATUS FOR RECEIVING PARALLEL DATA AND METHOD THEREOF

BACKGROUND OF THE INVENTION

Field of the Invention

The present invention relates to a system for transmitting parallel data at high-speed and specifically it relates to a data reception apparatus and a method of synchronizing the phases between bits.

When a large-scale multiprocessor system is configured using a computer, high throughput is requested for the bus that connects the LSI (Large Scale Integration) of a memory system and the LSI of a processor. Therefore, the transmission rate (data rate) of the bus becomes higher as the LSI is speeded up.

Regarding the parallel data transmission for transmitting data among these apparatuses using a plurality of signal lines, various systems have been conventionally proposed (for example, referrer to patent literatures 1 to 6).

[Patent literature 1] Japanese patent application laid-open publication No. 2002-223208

[Patent literature 2] PCT international patent application laid-open publication No. WO96/29655

[Patent literature 3] Japanese patent application laid-open publication No. 5-75594

[Patent literature 4] Japanese patent application laid-open publication No. 6-53955

[Patent literature 5] Japanese patent application laid-open publication No. 2000-261297

[Patent literature 6] Japanese patent application laid-open publication 11-275066

However, there are the following problems in the conventional parallel transmission.

A phase difference occurs among bits if parallel data is only received using the clock signal that is adjusted for each bit at a reception end. For example, in the case where there is the skew between two data signals that are transmitted at the same time and a phase difference occurs between a bit0 and a bit1, as shown in FIG. 1, it is not clear which of the two timings of a Case A and a Case B shows the combination of the same time data. Furthermore, some combinations other than the combination of these two timings might correspond to the same time data.

Thereupon, parallel data should be received on a reception side after this phase difference is adjusted and each bit is synchronized with the internal clock of a reception apparatus.

When a data rate becomes high, however, the effective time of data becomes short and sometimes it becomes shorter than the signal arrival time to a reception end. Furthermore, both the differences in time periods of transmitting clock signals for sampling data to respective reception flip-flop circuits and the fluctuations due to the environments relatively increase so that they cannot be ignored. In addition, the differences in wiring lengths among a plurality of signals cannot be ignored. Because of this, the design of a circuit for sampling the data of all the bits using a clock tree has become physically difficult in parallel transmission. If it is difficult to draw this design, the setting has to be performed for each apparatus or each signal when the circuit is produced. However, this individual setting operation becomes a problem at the time of mass-production since the individual setting operation requires a lot of effort.

SUMMARY OF THE INVENTION

The subject of the present invention is to offer an apparatus and a method of receiving data while synchronizing phases between bits in a system for transmitting parallel data at high speed.

The data reception apparatus of the present invention comprises a clock adjustment device, a data buffer device, a read device and a storage device and it receives the parallel data of a plurality of bits.

At the first aspect of the present invention, a clock adjustment device adjusts the first clock signal using a data signal for each bit in such a way that the set-up time and the hold time of the data signal are secured for each bit of parallel data and it generates adjustment clock signals a number of which is equal to a number of bits. The data buffer device fetches the data signal for each bit in accordance with the adjustment clock signal and retains a fixed number of data for each bit in chronological order. The read device selects the data of a plurality of bits in the data buffer device in chronological order and reads out the selected data as parallel data, in accordance with the second clock signal. The storage device stores the read-out parallel data.

At the second aspect of the present invention, the clock adjustment device adjusts the first clock signal using the data signal of the bit in a group and it generates adjustment clock signals the number of which is equal to that of groups in such a way that the set-up time and hold time of a data signal are secured for each group that includes two or more bits of parallel data. The data buffer device fetches the data signal for each bit in the group and it retains a fixed number of data for each bit in chronological order, in accordance with the adjustment clock signal for each group. The read device selects the data of a plurality of bits in the data buffer device 102 in chronological order and it reads out the selected data as parallel data, in accordance with the second clock signal. The storage device 104 stores the read-out parallel data.

BRIEF EXPLANATION OF THE DRAWINGS

FIG. 1 shows a phase difference between bits;

FIG. 2B shows the configuration of a data transmission system;

FIG. 3 shows the configuration of the first reception apparatus;

FIG. 5 shows the configuration of a ring buffer/write pointer circuit/first read pointer circuit;

FIG. 15 shows the configuration of the third read pointer circuit;

FIG. 17 shows the configuration of the second reception apparatus.

DESCRIPTION OF THE PREFERRED EMBODIMENTS

The following is the detailed explanation of the preferred embodiments of the present invention in reference to the drawings.

Figure 2A:
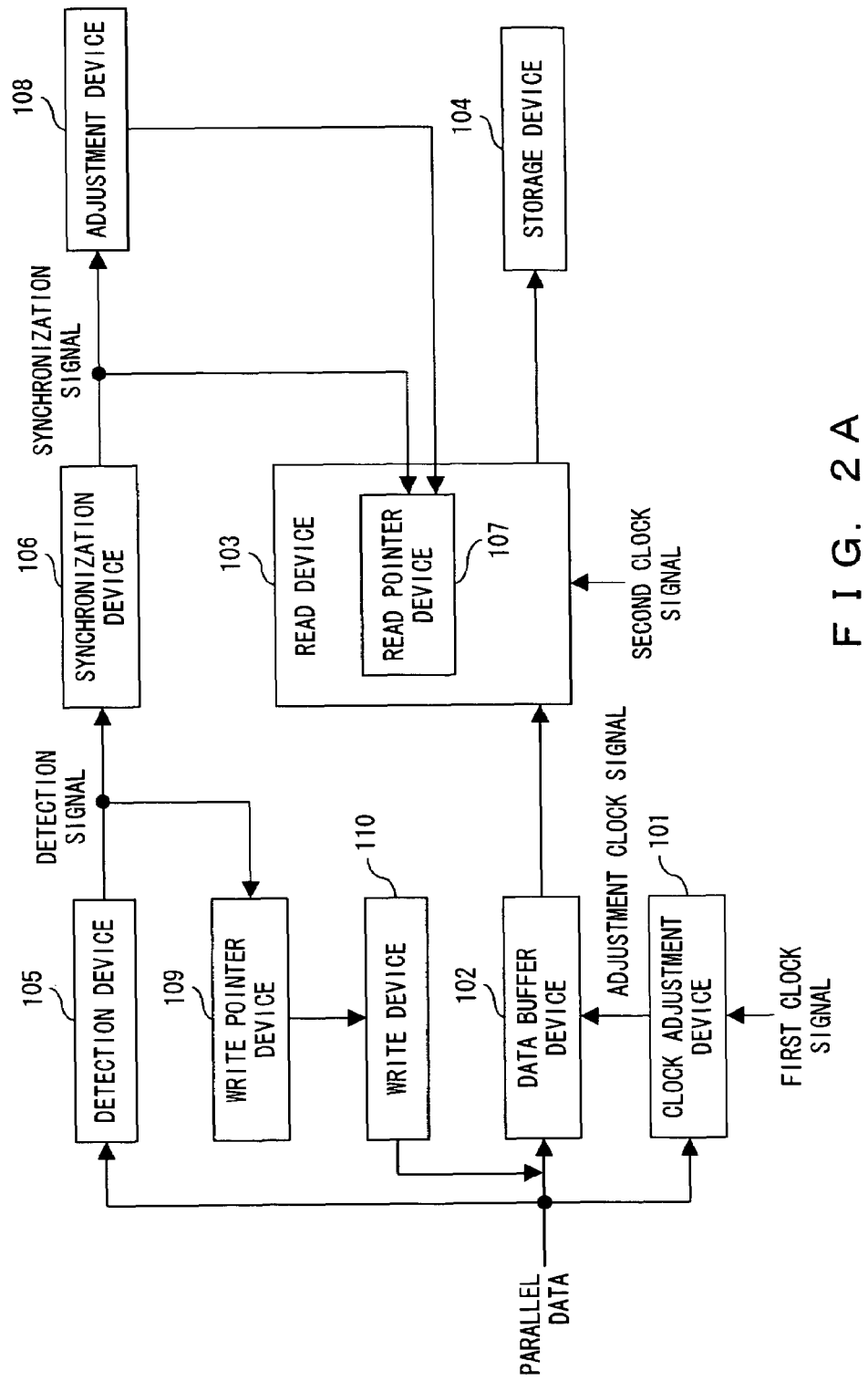
FIG. 2A shows the principle of a data reception apparatus of the present invention.

FIG. 2A shows the principle of a data reception apparatus of the present invention. The data reception apparatus of FIG. 2A comprises a clock adjustment device 101, a data buffer device 102, a read device 103, a storage device 104, a detection device 105, a synchronization device 106, an adjustment device 108, a write pointer device 109 and a write device 110 and it receives the parallel data of a plurality of bits.

At the first aspect of the present invention, the data reception apparatus comprises the clock adjustment device 101, the data buffer device 102, the read device 103 and the storage device 104. The clock adjustment device 101 adjusts the first clock signal using the data signal for each bit in such a way that the set-up time and the hold time of a data signal are secured for each bit of parallel data and it generates adjustment clock signals the number of which is equal to that of bits. The data buffer device 102 fetches the data signal for each bit and retains a fixed number of data for each bit in chronological order, in accordance with the adjustment clock signal. The read device 103 selects the data of a plurality of bits in the data buffer device 102 in chronological order and it reads out the selected data as parallel data, in accordance with the second clock signal. The storage device 104 stores the read-out parallel data.

According to such a data reception apparatus, the set-up time and hold time for each bit are secured by the adjustment clock signal generated by the clock adjustment device 101. Then, the data signal of each bit is fetched in the data buffer device 102 at appropriate timing. Furthermore, the differences among bits are adjusted by reading out the data of a plurality of bits all at once by the read device 103 in accordance with the second clock signal so that the parallel data of a correct combination is extracted.

At the second aspect of the present invention, the data reception apparatus comprises the clock adjustment device 101, the data buffer device 102, the read device 103 and the storage device 104. The clock adjustment device 101 adjusts the first clock signal using the data signal of the bit in a group and generates adjustment clock signals the number of which is equal to that of groups in such a way that the set-up time and hold time of a data signal are secured for each group that includes two or more bits of parallel data. The data buffer device 102 fetches the data signal for each bit in the group and it retains a fixed number of data for each bit in chronological order, in accordance with the adjustment clock signal for each group. The read device selects the data of a plurality of bits in the data buffer device 102 in chronological order and reads out the selected data as parallel data, in accordance with the second clock signal. The storage device 104 stores the read-out parallel data.

According to such a data reception apparatus, the differences among bits are adjusted in the same way as in the data reception apparatus at the first aspect so that the parallel data of a correct combination is extracted. In comparison with the data reception apparatus at the first aspect, furthermore, hardware can be reduced by sharing the clock adjustment device 101 in respect of two or more bits.

At the third aspect of the present invention, the data reception apparatus at the first or the second aspect further comprises the detection device 105 and the synchronization device 106. The data buffer device 102 includes a fixed number of buffer devices for retaining a fixed number of data in chronological order. The read device 103 includes a read pointer device 107. The detection device 105 detects the reception of the time-series data that is determined in advance and outputs the detection signal. The synchronization device 106 synchronizes the detection signal with the second clock signal and generates a synchronization signal. The read pointer device 107 operates in accordance with the second clock signal and stores read pointer information that indicates the buffer device in which the data to be read out next is retained from among a fixed number of buffer devices in the data buffer devices 102. When a synchronization signal is outputted from the synchronization device 106, the read pointer device 107 sets the read pointer information to a predetermined value and updates the read pointer information in such a way that a fixed number of buffer devices are selected in predetermined order.

According to such a data reception apparatus, it becomes possible to read out data from the plurality of buffer devices in the data buffer device 102 in chronological order by resetting the read pointer information upon receipt of the time-series data like training data.

At the fourth aspect of the present invention, the data reception apparatus at the third aspect further comprises the adjustment device 108. The adjustment device 108 delays a synchronization signal only by a predetermined number of clocks. The read pointer device 107 sets the read pointer information to a predetermined value when the synchronization signal is outputted from the adjustment device 108.

According to such a data reception apparatus, the read pointer information is set to a predetermined value after a predetermined period has passed since the time-series data of a specified bit is received. Therefore, it becomes possible to reset the read pointer information after the time-series data of all the bits of parallel data is received if the number of delay clocks is appropriately set.

At the fifth aspect of the present invention, the data reception apparatus at the third aspect further comprises the write pointer device 109 and the write device 110. The write pointer device 109 stores the write pointer information that indicates a buffer device in which data is stored next from among a fixed number of buffer devices in the data buffer device 102. In addition, when the detection signal is outputted from the detection device 105, the device 109 sets the write pointer information to a predetermined value and updates the write pointer information in such a way that a fixed number of buffer devices are selected in predetermined order. The write device 110 inputs a data signal into the buffer device that is indicated by the pointer information.

According to such a data reception apparatus, it becomes possible to reset the write pointer information upon receipt of the time-series data like training data and to sequentially write data in a plurality of buffer devices in the data buffer device 102.

The clock adjustment device 101, the data buffer device 102, the storage device 104, the detection device 105, the synchronization device 106, the read pointer device 107, the adjustment device 108 and the write pointer device 109 correspond to, for example, a ring buffer 305, a reception register 314, a write pointer reset timing detection circuit 303, a synchronization circuit 311, a read pointer circuit 313, an adjustment circuit 312 and a write pointer circuit 304 of FIGS. 3 and 17 that are described later, respectively.

The read device 103 corresponds to, for example, the read pointer circuit 313, and a decoder 512 and a selector 531 of FIG. 5 that are described later. The write device 110 corresponds to, for example, a decoder 511, AND circuits 522-j and 523-j and OR circuits 524-j (j=0, 1, . . . , 15) of FIG. 5.

The first clock signal, the second clock signal, an adjustment clock signal and a detection signal correspond to, for example, clk, CLKIN, iclk#0 and rst-tim#0 of FIGS. 3 and 17, respectively. A synchronization signal corresponds to, for example, RPTR_RST_SYNC of FIGS. 7 and 8 that are described later.

According to the present invention, a big difference in the transmission time between bits that occurs with the high speed transmission of parallel data is dynamically adjusted and the data of a correct combination can be received. Also, the present invention can deal with the fluctuation due to the change of environments during operation so that the setting for an individual unit is not required when producing the individual unit.

FIG. 2B shows the configuration of a data transmission system of the preferred embodiment of the present invention. The data transmission system of FIG. 2B comprises a transmission apparatus 201, a reception apparatus 202 and an oscillator 203. The transmission apparatus 201 transmits the parallel data of n bits to the reception apparatus 202. For example, the wiring pattern of a printed board connects between the transmission apparatus 201 and the reception apparatus 202.

The transmission apparatus 201 comprises a phased locked loop (PLL) 211, a D flip-flop circuit 212, a pattern generator 213, a selector 214 and an output buffer 215. The PLL 211 generates a unique clock signal from a clock signal for reference that is supplied from the oscillator 203 and then it generates the transmission data of n bits in accordance with the unique clock signal. As transmission data, regular operation data and training data are generated.

The flip-flop circuit 212 retains operation data while the pattern generator 213 generates the training data that is time-series data determined in advance. The selector 214 switches inputs according to the mode signal outputted from a mechanism for controlling the whole system. When the mode signal shows an operation mode, the output of the flip-flop circuit 212 is selected. When the mode signal shows a tuning mode, an output of the pattern generator 213 is selected. The output buffer 215 outputs the transmission data that is selected by the selector 214 to the reception apparatus 202.

The reception apparatus 202 comprises a PLL 221 and reception circuits 222 and 223. The PLL 221 generates an internal clock signal CLKIN from the clock signal that is supplied from the oscillator 203 and outputs the generated signal to the reception circuit 223. In addition, the clock signal from the oscillator 203 is inputted into the reception circuit 222 as a clock signal clk.

The reception circuit 222 includes n bit data retention circuits 224-i (i=0, 1, . . . , n−2, n−1) that are provided for each bit of parallel data. The bit data retention circuit 224-i generates an adjustment clock signal by adjusting phases of the clock signal clk and operates in accordance with the clock signal, thereby retaining data for one bit. The reception circuit 223 is provided for each parallel bus and operates in accordance with the clock signal CLKIN, thereby retaining the data for all the bits of the parallel buses.

FIG. 3 shows the configuration example of the reception apparatus 202 of FIG. 2B. The reception apparatus 202 of FIG. 3 comprises an input buffer 301. The bit data retention circuit 224-0 comprises a clock adjustment circuit 302, a write pointer reset timing detection circuit 303, a write pointer circuit 304 and a ring buffer 305. In addition, the reception circuit 223 comprises a synchronization circuit 311, an adjustment circuit 312, a read pointer circuit 313 and a reception register 314.

The input buffer 301 is the exclusive use buffer for matching the level of an input signal from the outside of an LSI with that of an internal part of the LSI. This buffer separates the parallel data from the transmission apparatus 201 into data signals it#i (i=0, 1, . . . , n−2, n−1) for each bit and outputs these signals to the bit data retention circuit 224-i.

The clock adjustment circuit 302 detects a change point of the data signal it#0 and adjusts the clock signal clk based on this point in such a way that a set-up time and a hold time of the data signal it#0 can be secured, thereby generating an adjustment clock signal iclk#0. The write pointer reset timing detection circuit 303 detects training data from the data signal it#0 that is inputted in chronological order and outputs a signal rst-tim#0 to the write pointer circuit 304 and the synchronization circuit 311.

The ring buffer 305 includes a plurality of buffers and retains a plurality of data for the plurality of buffers in chronological order. In order to write data in the ring buffer 305, the write pointer circuit 304 retains as a write pointer the value indicating the buffer into which data is to be written at the next clock. The write pointer circulates values for each of the buffers of the ring buffer 305 and these values are reset by the signal rst-tim#0. The ring buffer 305 stores the value of data signal it#0 in the buffer indicated by the value of the write pointer. Other buffers retain the values that are already stored. As a write pointer, for example, the buffer number is used.

The write pointer reset timing detection circuit 303, the write pointer circuit 304 and the ring buffer 305 operate in accordance with the clock signal iclk#0. The configuration and operation of other bit data retention circuit 224 are identical to those of the bit data retention circuit 224-0.

The read pointer circuit 313 retains the value that indicates the buffer to be read out next as a read pointer in order to read out data in chronological order from the ring buffer 305. The read pointer circulates the values for the respective buffers of the ring buffer 305 in the same way as the write pointer. The reading-out processing of a buffer is implemented regardless of the writing processing and the data of the buffer indicated by a value of the read pointer is selected to be read out all at once from the respective ring buffers 305 of the bit data retention circuits 224-0 to 224-(n−1)

The reception register 314 stores the data that is read out from the bit data retention circuits 224-0 to 224-(n−1) in accordance with the clock signal CLKIN as whole parallel data. Thus, the parallel data that is transmitted at the same time from the transmission apparatus 201 is sampled.

The synchronization circuit 311 includes a plurality of flip-flop circuits and synchronizes the output signal rst-tim#0 of the write pointer reset timing detection circuit 303 with the clock signal CLKIN, thereby outputting the synchronized signal to the adjustment circuit 312. The write pointer reset timing detection circuit 303 is provided for each bit. In this example, however, the bit #0 is selected as the representative bit of parallel data and only the signal rst-tim#0 is connected with the synchronization circuit 311.

The adjustment circuit 312 further delays an output signal of the synchronization circuit 311 and outputs the delayed signal to the read pointer circuit 313. Furthermore, this circuit includes a mechanism for setting the number of delay clocks. In this adjustment circuit 312, one of a fixed number of conditions is set and an output signal of synchronization circuit 311 is outputted from the adjustment circuit 312 while being delayed by the number of clocks corresponding to the set up condition. The read pointer is reset by an output signal of the adjustment circuit 312. In the case where the output signal of the synchronization circuit 311 need not be delayed, the adjustment circuit 312 may be omitted.

The synchronization circuit 311, the adjustment circuit 312, the read pointer circuit 313 and the reception register 314 operate in accordance with the clock signal CLKIN.

According to such reception apparatus 202, a set-up time and a hold time for each bit are secured by the bit data retention circuit 224-$i$ and the difference between the bits is adjusted by the reception circuit 223, thereby extracting the parallel data of a correct combination.

The following is the detailed explanation of the specific circuit configurations of the bit data retention circuit 224-$i$ and the reception circuit 223 of FIG. 3 in reference to FIGS. 4 to 10.

Figure 4:
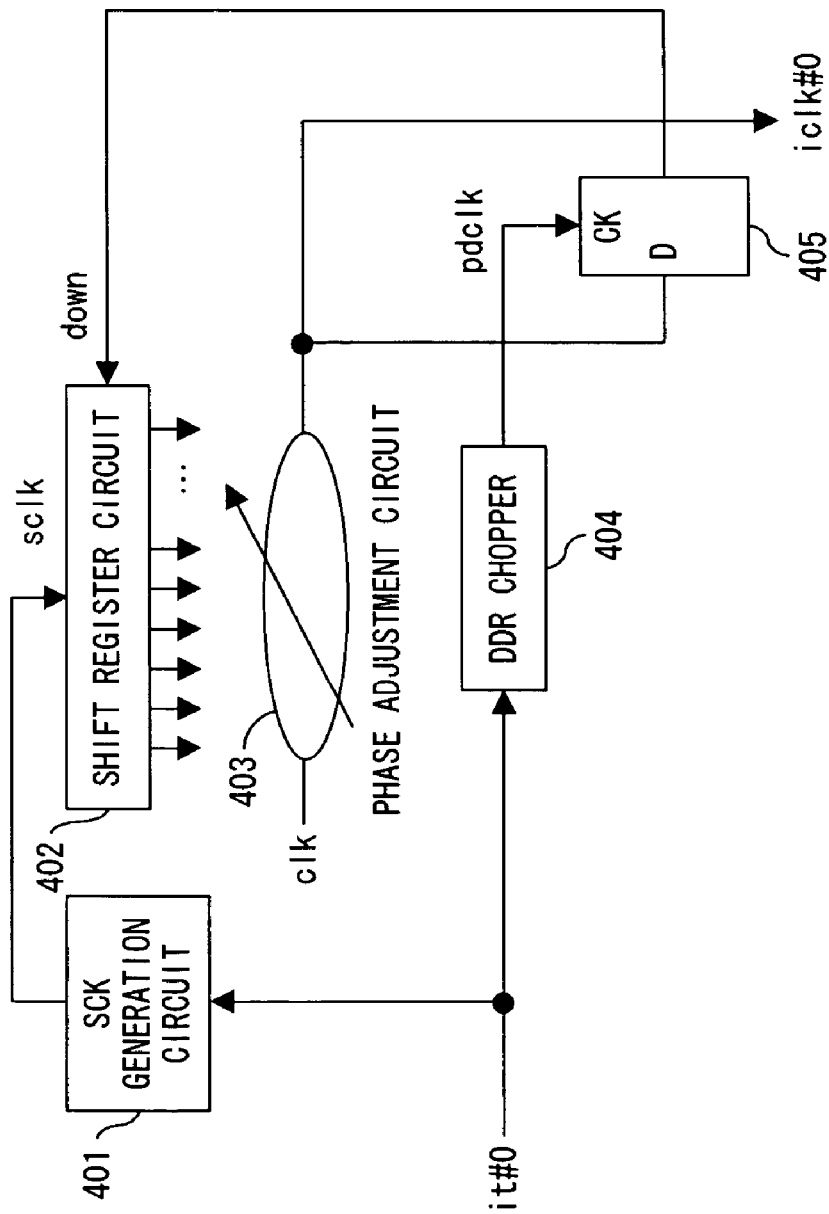
FIG. 4 shows the configuration of a clock adjustment circuit.

FIG. 4 shows the configuration example of the clock adjustment circuit 302 of FIG. 3. The clock adjustment circuit of FIG. 4 comprises an sclk generation circuit 401, a shift register circuit 402, a phase adjustment circuit 403, a DDR (Double Data Rate) chopper 404 and a D flip-flop circuit 405.

The sclk generation circuit 401 generates a timing signal sclk from a data signal it#0 and outputs the generated signal to the shift register circuit 402. The shift register circuit 402 generates a control signal for the phase adjustment circuit 403 according to a control signal down that is outputted from a flip-flop circuit 405. The phase adjustment circuit 403 adjusts the phase of a clock signal clk and generates a clock signal iclk#0, in accordance with the control signal from the shift register circuit 402. The generated clock signal iclk#0 is inputted into a terminal D of the flip-flop circuit 405 as a data signal.

The DDR chopper 404 generates a clock signal pdclk from the rising/falling (up/down) edge of the data signal it#0. The generated clock signal pdclk is inputted into a terminal CK of the flip-flop circuit 405.

The flip-flop circuit 405 functions as a phase detection apparatus for detecting the phase relation between a clock signal iclk#0 and a data signal it#0 and latches the clock signal iclk#0 in accordance with a clock signal pdclk, thereby generating a control signal down.

In this way, the shift register circuit 402 determines whether the value of the control signal down is logic '1' or '0' and controls the increase and decrease of a delay amount of the phase adjustment circuit 403. Thus, the feed back loop for adjustment is formed so that the effective edge of the clock signal iclk#0 for sampling the data signal it#0 can be matched with a point where the data signal it#0 is stable.

FIG. 5 shows the configuration examples of the write pointer circuit 304, the ring buffer 305 and the read pointer circuit 313 of FIG. 3. The write pointer and the read pointer are respectively controlled to transit a fixed number of conditions in predetermined order.

The write pointer circuit 304 of FIG. 5 can include a freerun counter and comprises an AND circuit 501, a D flip-flop circuit 502 and an addition circuit 503. The AND circuit 501 outputs the logical product of the value obtained by inverting a signal rst-tim#0 from the write pointer reset timing detection circuit 303 and the output of the addition circuit 503, to the flip-flop circuit 502.

The flip-flop circuit 502 latches the output of the AND circuit 501 and retains the latched output as a write pointer WPTR [3:0] of four bits, in accordance with a clock signal iclk#0. The addition circuit 503 adds 1 to the value of WPTR [3:0] that is outputted from the flip-flop circuit 502 and it outputs the obtained value to the AND circuit 501. In this way, the write pointer circulates a value of '0' to '15' and this value is reset to '0' when the value of the signal rst-tim#0 is '1'.

The ring buffer 305 comprises decoders 511 and 512, a D flip-flop circuit 521-$j$, AND circuits 522-$j$ and 523-$j$, an OR circuit 524-$j$ ($j$=0, 1, . . . , 15) and a selector 531.

The decoder 511 decodes the value of WPTR [3:0] that is outputted from the write pointer circuit 304 and generates a selection signal BUF_WE [15:0] of sixteen bits, thereby outputting the generated signal to the AND circuits 522-0 to 522-15 and 523-0 to 523-15 for each bit. In this case, only the bit indicated by the value of WPTR [3:0] among selection signals BUF_WE [15:0] becomes '1' and other bits become '0'.

The AND circuit 522-$j$ outputs to the OR circuit 524-$j$ the logical product of the value of a bit j of the selection signal BUF_WE [15:0] and the data signal it#0. The AND circuit 523-$j$ outputs to the OR circuit 524-$j$ the logical product of the value obtained by inverting a bit j of the selection signal BUF_WE [15:0] and an output of the flip-flop circuit 521-$j$. The OR circuit 524-$j$ outputs to the flip-flop circuit 521-$j$ the logical sum of outputs of the AND circuit 522-$j$ and the AND circuit 523-$j$. Then, the flip-flop circuit 521-$j$ latches an output of the OR circuit 524-$j$ and outputs the latched output to the selector 531, in accordance with the clock signal iclk#0.

Therefore, when a bit j of the selection signal BUF_WE [15:0] is '1' the data signal it#0 is stored only in the flip-flop circuit 521-$j$ among sixteen flip-flop circuits 521-0 to 521-15 and other flip-flop circuits 521 retain data same as before.

The decoder 512 decodes the value of the read pointer RPTR [3:0] of four bits that is outputted from the read pointer circuit 313 and generates the selection signal BUF_SEL [15:0] of sixteen bits, thereby outputting the generated signal to the selector 531. In this case, the only bit indicated by the value of RPTR [3:0] among the selection signal BUF_SEL [15:0] becomes '1' and other bits become '0'. The selector 531 selects the output of the flip-flop circuit 521-$j$ when the bit j is '1', thereby outputting the selected output to the reception register 314.

The reception register 314 comprises the D flip-flop circuit 551. The flip-flop circuit 551 latches an output of the selector 531 and retains the latched output as reception data, in accordance with the clock signal CLKIN.

The read pointer circuit 313 can be composed of a counter in the same way as the write pointer circuit 304. The read pointer circuit 313 comprises an AND circuit 541, a D flip-flop circuit 542 and an addition circuit 543. The AND circuit 541 outputs to the flip-flop circuit 542 the logical product of the value obtained by inverting a signal RPTR_RST_D from the adjustment circuit 312 and the output of an addition circuit 543.

The flip-flop circuit 542 latches an output of the AND circuit 541 and retains the latched output as RPTR [3:0], in accordance with the clock signal CLKIN. The addition circuit 543 adds 1 to the value of RPTR [3:0] that is outputted from the flip-flop circuit 542 and outputs the obtained value to the AND circuit 541. In this way, the read pointer circulates the value of '0' to '15' and the pointer is reset to '0' when the signal RPTR_RST_D is '1'.

Here, the write pointer WPTR [3:0] and the read pointer RPTR [3:0] are reset to '0' but they might be reset to a specified value other than '0'.

Figure 6:
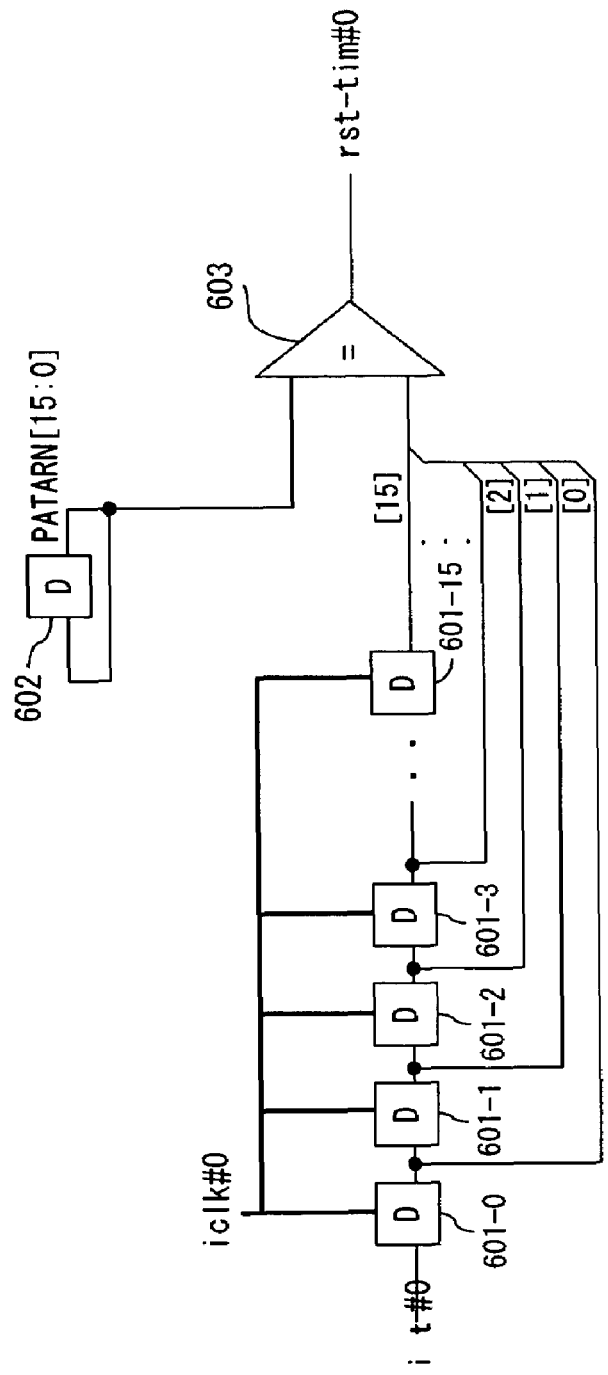
FIG. 6 shows the configuration of a write pointer reset timing detection circuit.

FIG. 6 shows the configuration example of the write pointer reset timing detection circuit 303 of FIG. 3. The write pointer reset timing detection circuit of FIG. 6 comprises the shift register circuit including sixteen D flip-flop circuits 601-j (j=0, 1, . . . , 15), a D flip-flip circuit 602 and a comparison circuit 603.

Each flip-flop circuit 601-j shifts the data signal it#0 that is inputted in chronological order in accordance with the clock signal iclk#0 to a flip-flop circuit 601-(j+1) at the next stage. The flip-flop circuit 602 retains the same pattern as the pattern of the training data of sixteen bits that is transmitted from the transmission apparatus 201 as PATARN [15:0].

The comparison circuit 603 outputs '1' as a signal rst-tim#0 when outputs of the flip-flop circuits 601-0 to 601-15 and an output of the flip-flop circuit 602 are compared and these outputs match with each other. Therefore, a reset momentum signal of the write pointer is outputted when the data matching with the pattern that is set in PATARN [15:0] is arranged in the shift register circuit.

Figure 7:
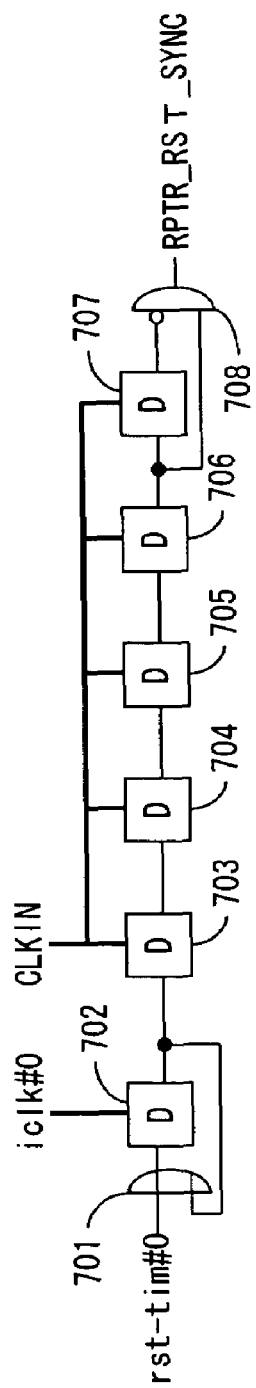
FIG. 7 shows the configuration of the first synchronization circuit.

FIG. 7 shows the configuration example of synchronization circuit 311 of FIG. 3. The synchronization circuit of FIG. 7 comprises an OR circuit 701, D flip-flop circuits 702 to 707 and an AND circuit 708. The OR circuit 701 outputs the logical sum of a signal rst-tim#0 and an output of the flip-flop circuit 702 to the flip-flop circuit 702. Then, the flip-flop circuit 702 latches an output of the OR circuit 701 and outputs the latched output, in accordance with a clock signal iclk#0.

The flip-flop circuits 703 to 707 shift the output of the flip-flop circuit 702 to a flip-flop circuit at the next stage in accordance with a clock signal CLKIN. The AND circuit 708 outputs the logical product of the value obtained by inverting an output of the flip-flop circuit 707 and an output of the flip-flop circuit 706 as a signal RPTR_RST_SYNC.

In this way, a signal RPTR_RST_SYNC obtained by synchronizing a signal rst-tim#0 that becomes the reset momentum of a write pointer with the clock signal CLKIN is generated. The generated signal RPTR_RST_SYNC is used to generate a signal RPTR_RST_D that becomes the reset momentum of a read pointer.

In FIG. 3, a bit #0 is selected as the representative bit of parallel data and a read pointer is reset only on the basis of a signal rst-tim#0. However, it can be appropriate that the read pointer is reset based on two or more signals rst-tim#i (i=0, 1 . . . , n−2, n−1) that are outputted from the write pointer reset timing detection circuits for two or more bits of parallel data.

Figure 8:
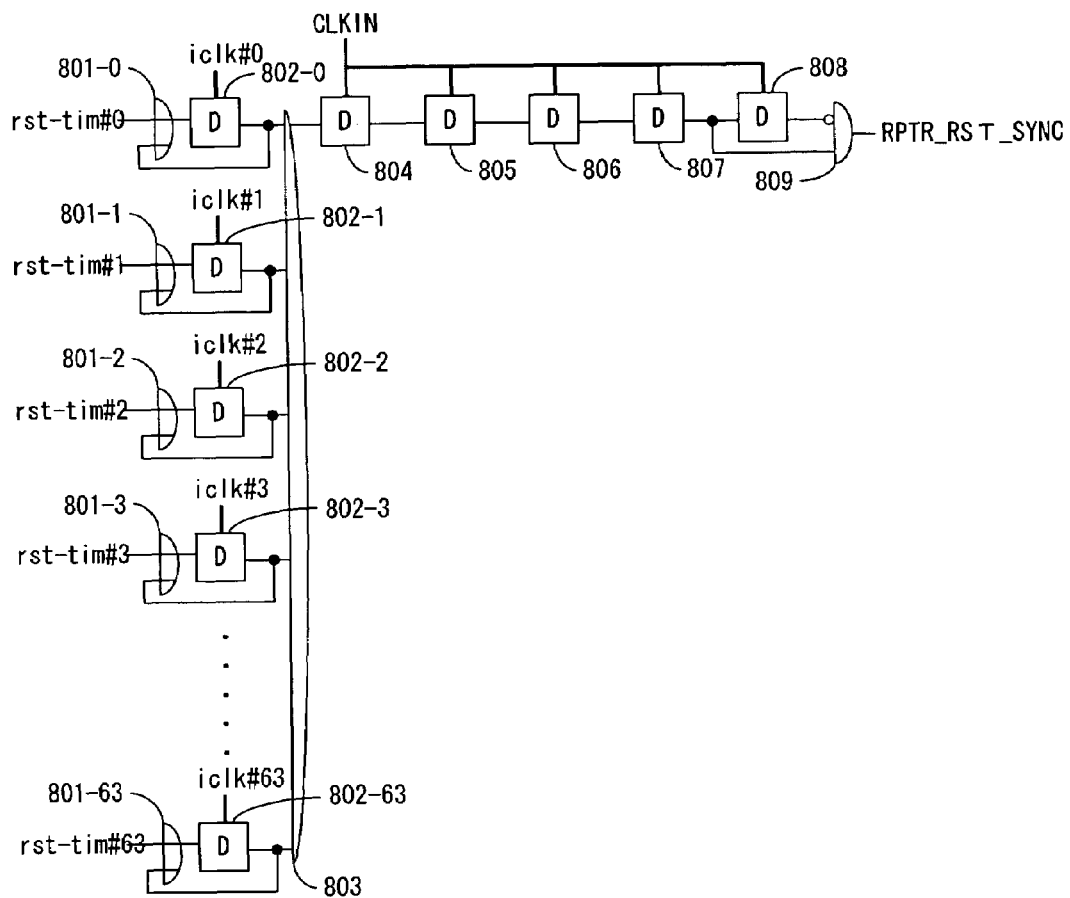
FIG. 8 shows the configuration of the second synchronization circuit.

FIG. 8 shows the configuration example of the synchronization circuit that waits for write pointer reset of all the bits of parallel data in the case of n=64 and generates a signal RPTR_RST_SYNC. The synchronization circuit of FIG. 8 comprises an OR circuit 801-i (i=0, 1, . . . , 63), a D flip-flop circuit 802-i, AND circuits 803 and 809 and D flip-flop circuits 804 to 808.

The OR circuit 801-i outputs the logical sum of the signal rst-tim#i and the output of the flip-flop circuit 802-i to the flip-flop circuit 802-i. Then, the flip-flop circuit 802-i latches the output of the OR circuit 801-i and outputs the latched output, in accordance with the clock signal iclk#i. The AND circuit 803 outputs to the flip-flop circuit 804 the logical product of the outputs of the flip-flop circuits 802-0 to 802-63.

The flip-flop circuits 804 to 808 shift the output of the AND circuit 803 to the flip-flop circuit at the next stage in accordance with the clock signal CLKIN. The AND circuit 809 outputs the logical product of the value obtained by inverting an output of the flip-flop circuit 808 and an output of the flip-flop circuit 807 as the signal RPTR_RST_SYNC.

In the case where the synchronization circuit 311 does not wait for the write pointer reset processing of all the bits, the adjustment circuit 312 of FIG. 3 compensates the difference among bits by setting to add a regular delay that is equivalent to the delay in the case of waiting for these reset processing. This adjustment circuit 312 is materialized, for example, by a counter circuit or a shift register circuit including a plurality of flip-flop circuits.

However, in the case where the difference between bits is comparatively small, there is the possibility that the unnecessary delay is generated by the synchronization circuit 311 and the adjustment circuit 312. This delay largely influences the performance of a processor as a memory latency. Thereupon, it is desirable to trace back to the necessarily sufficient timing and to generate the reset momentum of a read pointer in order to minimize this delay.

In this preferred embodiment, the delay at the time of reading out data is suppressed to the minimum by setting a delay equivalent to almost one cycle of a pointer value that includes the delay of the synchronization circuit 311 while utilizing the fact that the read pointer is configured to circulate.

Figure 9:
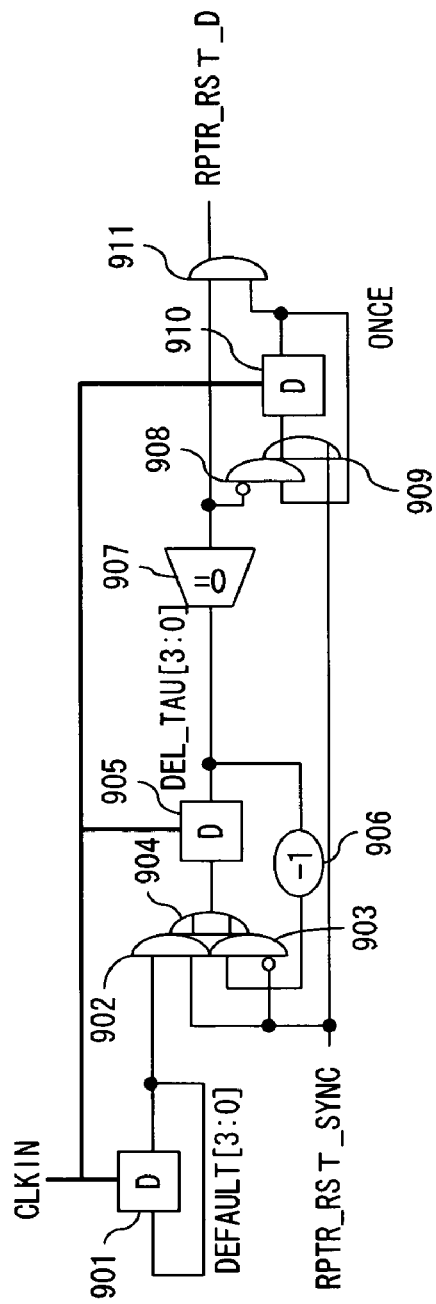
FIG. 9 shows the configuration of the first adjustment circuit.

FIG. 9 shows the configuration example of the adjustment circuit 312 of the case where a counter circuit is used. The adjustment circuit of FIG. 9 comprises D flip-flop circuits 901, 905 and 910, AND circuits 902, 903, 908 and 911, OR circuits 904 and 909, a subtraction circuit 906 and a detection circuit 907.

The flip-flop circuit 901 can set any one of 0 to 15 as an initial value using a signal DEFAULT [3:0] of four bits. The flip-flop circuit 901 outputs the thus-set value of DEFAULT [3:0] to the AND circuit 902 in accordance with a clock signal CLKIN.

The AND circuits 902 and 903, the OR circuit 904, the flip-flop circuit 905 and the subtraction circuit 906 configure a down counter. The AND circuit 902 outputs the logical product of a signal DEFAULT [3:0] and a signal RPTR_RST_SYNC. The AND circuit 903 outputs the logical product of an output of the subtraction circuit 906 and a value obtained by inverting the signal RPTR_RST_SYNC. The OR circuit 904 outputs the logical sum of an output of the AND circuit 902 and an output of the AND circuit 903.

The flip-flop circuit 905 latches an output of the OR circuit 904 and outputs the latched output as the signal DEL_TAU [3:0] indicating a counting value, in accordance with the clock signal CLKIN. The subtraction circuit 906 subtracts 1 from the value of the signal DEL_TAU [3:0] and outputs the subtracted value to the AND circuit 903. The detection circuit 907 detects the fact that the value of the signal DEL_TAU [3:0] becomes '0' and outputs a signal '1'.

The AND circuit 908 outputs the logical product of the value obtained by inverting an output of the detection circuit 907 and an output signal ONCE of the flip-flop circuit 910. The OR circuit 909 outputs the logical sum of the output of the AND circuit 908 and the signal RPTR_RST_SYNC. The flip-flop circuit 910 latches the output of the OR circuit 909 and outputs the latched output as the signal ONCE, in accordance with the clock signal CLKIN. The AND circuit 911 outputs the logical product of an output of the detection circuit 907 and the signal ONCE as a signal RPTR_RST_D.

According to such an adjustment circuit, when the signal RPTR_RST_SYNC becomes '1', the initial value that is retained in the flip-flop circuit 905 is loaded into the flip-flop circuit 905. Then, when the signal RPTR_RST_SYNC becomes '0', counting down is started. When the counting value becomes '0', '1' is outputted as a signal RPTR_RST_D and the read pointer is reset.

Therefore, when a delay time period is τ per one clock, the output signal of the synchronization circuit 311 is delayed in the range of 1 to 16τ so that the reset momentum of a read pointer can be adjusted.

Figure 10:
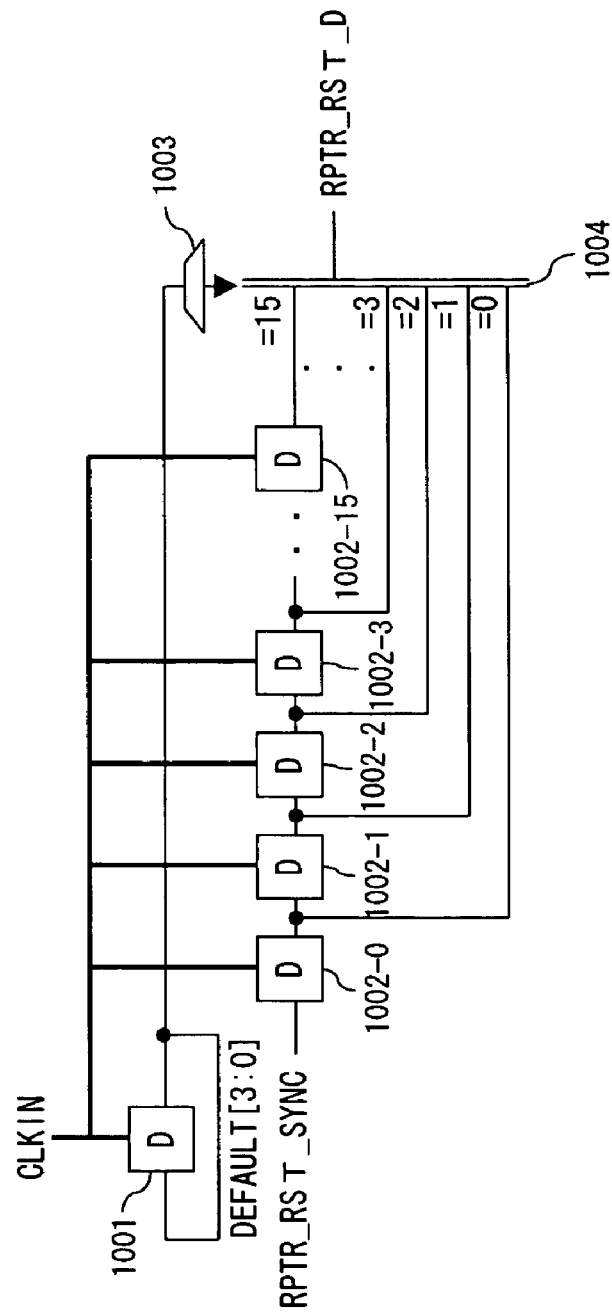
FIG. 10 shows the configuration of the second adjustment circuit.

FIG. 10 shows the configuration example of the adjustment circuit 312 in the case where a shift register circuit is used. The adjustment circuit of FIG. 10 comprises D flip-flop circuits 1001, 1002-j (j=0, 1, . . . , 15), a decoder 1003 and a selector 1004.

The flip-flop circuit 1001 retains the signal DEFAULT [3:0] indicating any one of initial values 0 to 15 in the same way as the flip-flop circuit 901 of FIG. 9 and outputs this signal to the decoder 1003 in accordance with a clock signal CLKIN. The decoder 1003 decodes the signal DEFAULT [3:0] of four bits and generate a selection signal, and outputs the generated selection signal to the selector 1004.

The flip-flop circuits 1002-0 to 1002-15 shift a signal RPTR_RST_SYNC to the flip-flop circuits at the next stage in accordance with a clock signal CLKIN. The output of each flip-flop circuit 1002-j is inputted into the selector 1004. Then, the selector 1004 selects the output from any one of flip-flop circuits 1002-j and it outputs the selected output as a signal RPTR_RST_D, in accordance with a selection signal from the decoder 1003.

According to such an adjustment circuit, the signal RPTR_RST_SYNC is delayed by the number of delay clocks corresponding to the value of the signal DEFAULT [3:0] and the delayed signal RPTR_RST_SYNC is outputted as a signal RPTR_RST_D. Therefore, such an adjustment can delay the output signal of the synchronization circuit 311 in the range of 1 to 16τ and can adjust the reset momentum of a read pointer in the same way as in FIG. 9.

Figure 11:
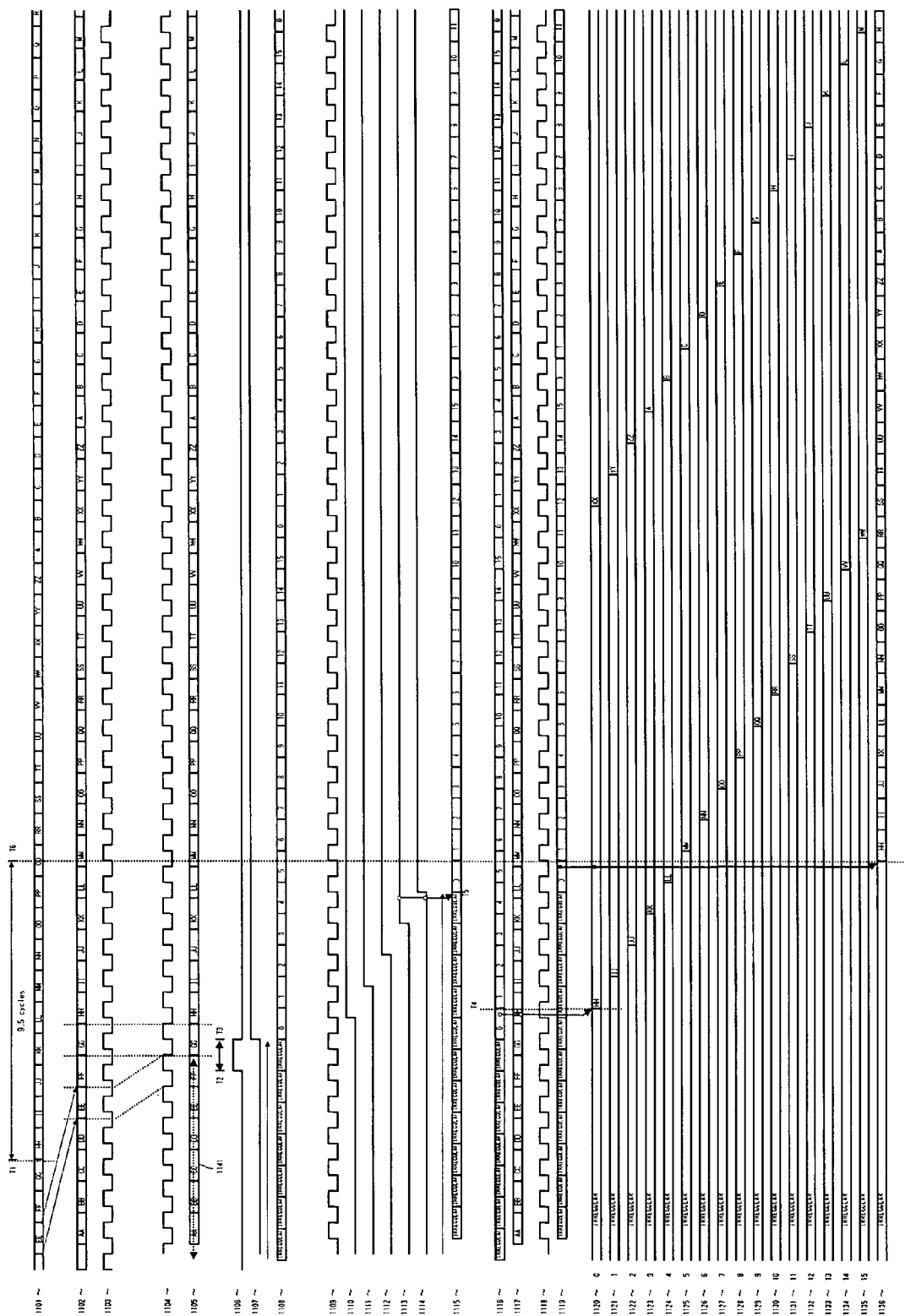
FIG. 11 is the first operation timing chart.
Figure 12:
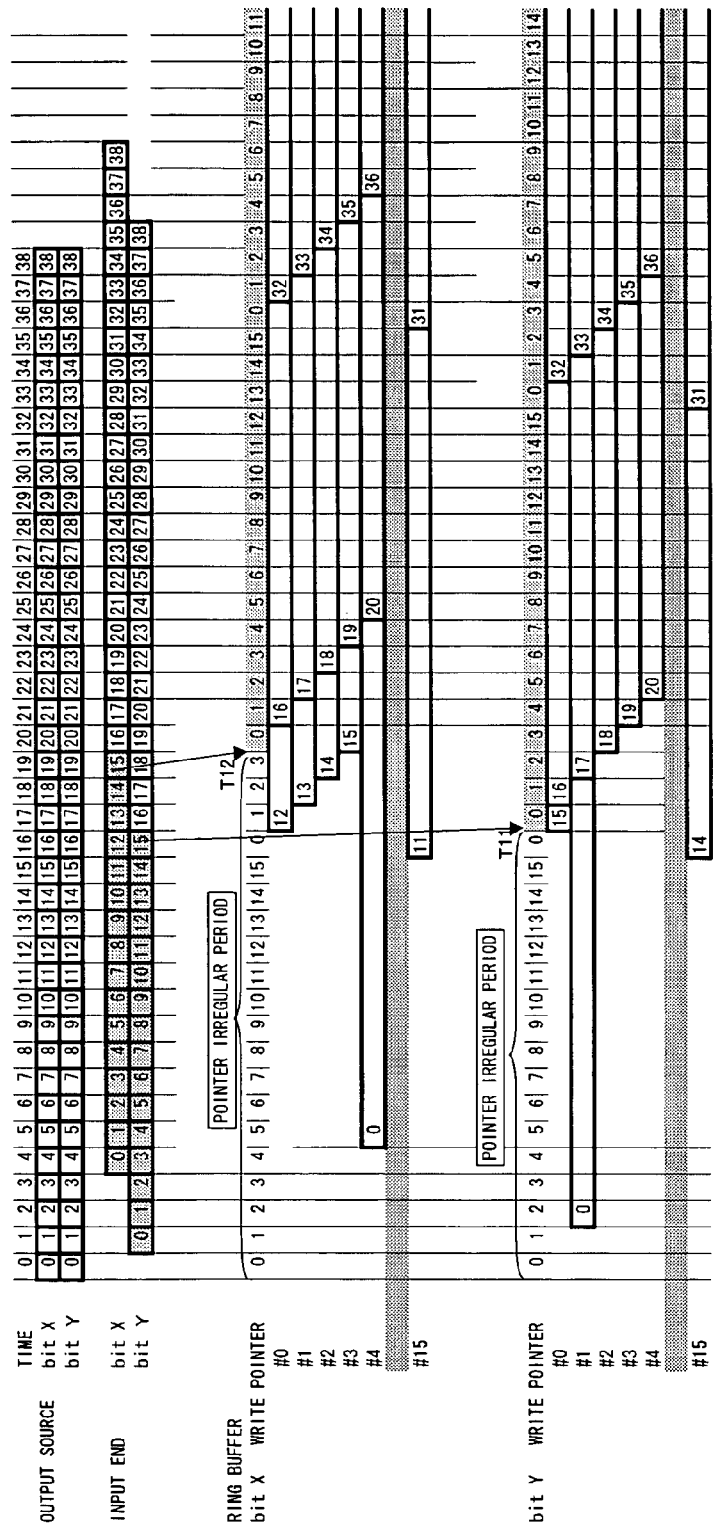
FIG. 12 is the timing chart of a write pointer reset processing.
Figure 13:
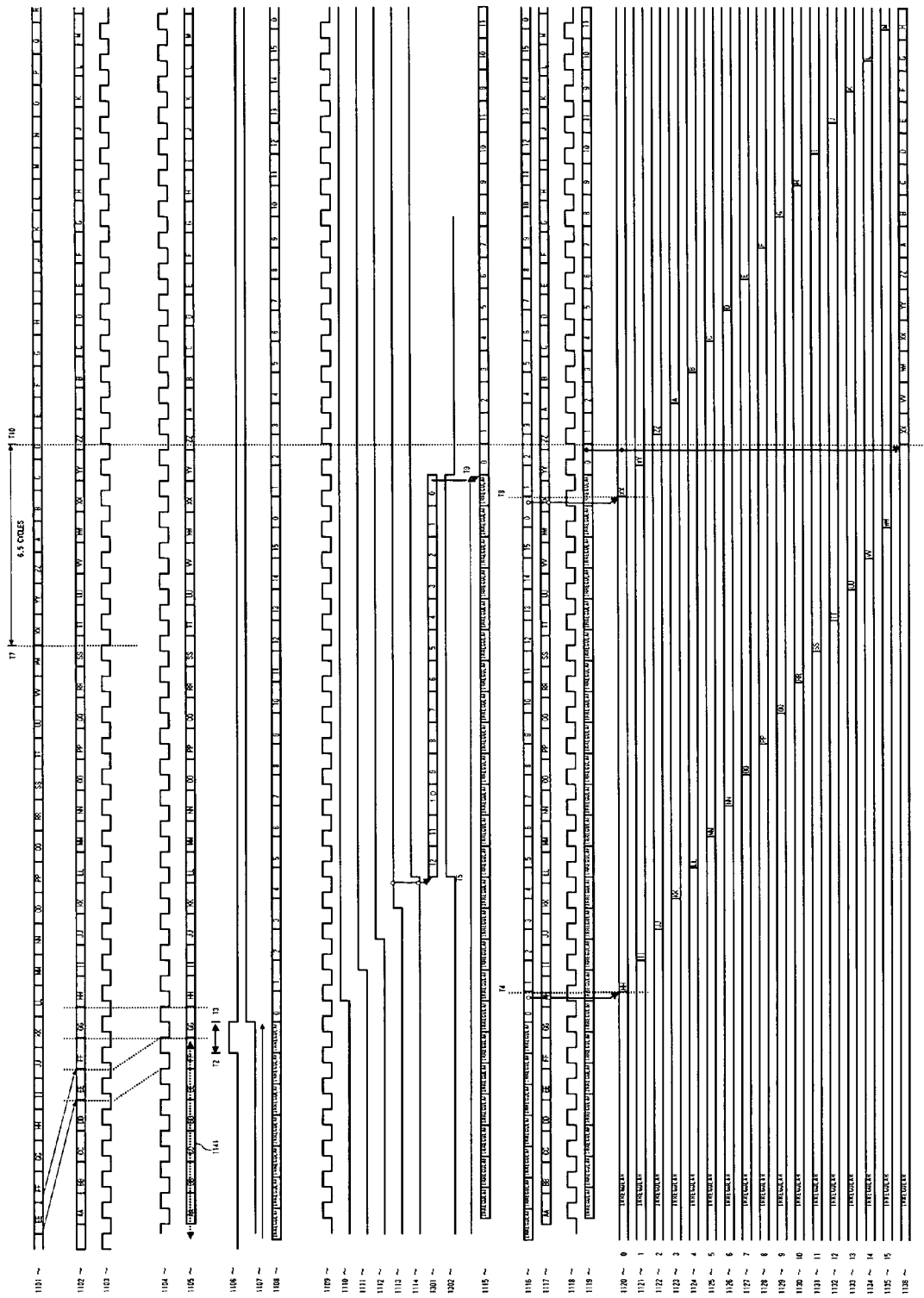
FIG. 13 is the second operation timing chart.

The following is the explanation of the concrete operations of bit data retention circuit 224-i and the reception circuit 223 of FIG. 3 in reference to FIGS. 11 to 13.

FIG. 11 is a timing chart that shows the operations in the case where the reception circuit 223 is not provided with the adjustment circuit 312. In this case, an output signal RPTR_RST_SYNC of the synchronization circuit of FIG. 7 is directly inputted into the read pointer circuit 313 as a reset momentum signal RPTR_RST_D. 1101 to 1136 indicate the timings of the following signals or data of a data transmission system.

<Pointer Reset (Apply to all Bits)>
1101: Transmission data of bit #0 of transmission apparatus 201
1102: Reception data of bit #0 of reception apparatus 202
1103: Clock signal clk
1104: Clock signal iclk#0
1105: Data signal it#0
1106: Signal rst-tim#0
1107: Output of flip-flop circuit 702 of FIG. 7
1108: Write pointer WPTR <Synchronization Circuit (Only Representative Bit)>
1109: Clock signal CLKIN
1110: Output of flip-flop circuit 703 of FIG. 7
1111: Output of flip-flop circuit 704 of FIG. 7
1112: Output of flip-flop circuit 705 of FIG. 7
1113: Output of flip-flop circuit 706 of FIG. 7
1114: Output of flip-flop circuit 707 of FIG. 7
1115: Read pointer RPTR <Data Flow>
1116: Write pointer WPTR
1117: Data signal it#0
1118: Clock signal CLKIN
1119: Read pointer RPTR
1120: Output of flip-flop circuit 521-0 of ring buffer 305 of FIG. 5
1121: Output of flip-flop circuit 521-1 of ring buffer 305 of FIG. 5
1122: Output of flip-flop circuit 521-2 of ring buffer 305 of FIG. 5
1123: Output of flip-flop circuit 521-3 of ring buffer 305 of FIG. 5
1124: Output of flip-flop circuit 521-4 of ring buffer 305 of FIG. 5
1125: Output of flip-flop circuit 521-5 of ring buffer 305 of FIG. 5
1126: Output of flip-flop circuit 521-6 of ring buffer 305 of FIG. 5
1127: Output of flip-flop circuit 521-7 of ring buffer 305 of FIG. 5
1128: Output of flip-flop circuit 521-8 of ring buffer 305 of FIG. 5
1129: Output of flip-flop circuit 521-9 of ring buffer 305 of FIG. 5
1130: Output of flip-flop circuit 521-10 of ring buffer 305 of FIG. 5
1131: Output of flip-flop circuit 521-11 of ring buffer 305 of FIG. 5
1132: Output of flip-flop circuit 521-12 of ring buffer 305 of FIG. 5
1133: Output of flip-flop circuit 521-13 of ring buffer 305 of FIG. 5
1134: Output of flip-flop circuit 521-14 of ring buffer 305 of FIG. 5
1135: Output of flip-flop circuit 521-15 of ring buffer 305 of FIG. 5
1136: Storage data of bit #0 of reception register 314

When a reset pattern 1141 that is transmitted as training data (1105) at time T2 corresponding to the rising edge of iclk#0 (1104) is detected, a signal rst-tim#0 (1106) becomes '1' and the signal rst-tim#0 becomes '0' at time T3 corresponding to the next rising edge. In this way, the output (1107) of the flip-flop circuit 702 becomes '1' and write pointers WPTR (1108, 1116) are reset. Until the reset is implemented, the write pointer WPTR circulates a proper value.

When the write pointer WPTR is reset, reception data 'HH' (1105, 1117) are written in a flip-flop circuit 521-0 (1120) of the ring buffer 305 at time T4 corresponding to the next rising edge of iclk#0 (1104). After that, each time the write pointer WPTR is incremented, the reception data are sequentially written in corresponding flip-flop circuit (1121 to 1135) of the ring buffer 305.

On the other hand, the output (1107) of the flip-flop circuit 702 sequentially propagates flip-flop circuits 703 to 707 (1110 to 1114) and an output signal RPTR_RST_SYNC of the synchronization circuit 311 becomes '1' when the flip-flop circuit 706 (1113) outputs '1'. Then, read pointers RPTR (1115, 1119) are reset at time T5 corresponding to the next rising edge of CLKIN (1109, 1118). Until the reset is implemented, the read pointers RPTR circulate proper values.

When the read pointers RPTR are reset, data 'HH' (1120) of the flip-flop circuit 521-0 of the ring buffer 305 is read out at time T6 corresponding to the next rising edge of CLKIN (1109, 1118) and the read-out data is stored in a bit #0 (1136) of the reception register 314. After that, each time the read pointers RPTR are incremented, data are sequentially read out from corresponding flip-flop circuit (1121 to 1135) of the buffer 305 and the read-out data are written in the bit #0 of the reception register 314.

In this example, the latency since data 'HH' is transmitted from the transmission apparatus 201 at time T1 until the data 'HH' is stored in the reception register 314 at time T6 becomes about 9.5 cycles.

FIG. 12 shows timing charts of the reset timings of write pointers in two bit data retention circuits 224-*i*. In this example, data of bits X and Y are outputted from the transmission apparatus 201 (output source) at the same time and the reception apparatus 202 (input edge) receives the data of the bit X behind the data of the bit Y. As a reset pattern, data rows 0 to 15 are used.

In this case, in the bit data retention circuits of a bit X and bit Y, the reset patterns are respectively detected at different timings and the write pointers are reset. The write pointer of a bit Y is reset at time T11 and then the reception data of a bit Y is written in the flip-flop circuit indicated by the write pointer of a ring buffer. In addition, the write pointer of a bit X is reset at time T12 and then the reception data of a bit X is written in the flip-flop circuit indicated by the write pointer of a ring buffer.

In this way, in general, the reset of a write pointer is implemented at different timing for each bit and parallel data is written in a ring buffer at the different timing for each bit. However, parallel data can be stored in the reception register 314 at the same timing by simultaneously reading out the data of all the bits from the ring buffer in accordance with an internal clock signal CLKIN.

FIG. 13 is the timing chart that shows the operation in the case where the reception circuit 223 is provided with the adjustment circuit of FIG. 9. In this example, '12' is set as the value of a signal DEFAULT [3:0] and the adjustment circuit 312 delays an output signal RPTR_RST_SYNC of the synchronization circuit 311 only by 13τ. 1101 to 1136 show timings of the signals and data same as that in FIG. 11. 1301 and 1302 shows the timings of the following signals.

<Adjustment Circuit (Only Representative Bit)>
1301: Signal DEL_TAU [3:0] of FIG. 9
1302: Signal ONCE of FIG. 9

In this case, the operations until time T5 are similar as those of FIG. 11. When the output signal RPTR_RST_SYNC of the synchronization circuit 311 becomes '1', the value of the signal DEFAULT [3:0] is loaded into the flip-flop circuit 905 and '12' is outputted as a signal DEL_TAU [3:0] (1301) at time T5. At the same time, a signal ONCE (1302) becomes '1' and counting down is started.

Then, the reception data 'XX' (1105, 1117) are written in the flip-flop circuit 521-0 (1120) of the ring buffer 305 at time T8. After that, each time the write pointer WPTR is incremented, the reception data is sequentially written in the corresponding flip-flop circuit (1121 to 1135) of the ring buffer 305.

When counting down terminates and '0' is outputted as the signal DEL_TAU [3:0] (1301), an output signal RPTR_RST_D of the adjustment circuit 312 becomes '1'. The read pointers RPTR (1115, 1119) are reset at time T9 corresponding to the next rising edge of CLKIN (1109, 1118) and at the same time the signal ONCE (1302) becomes '0'. Until the reset is implemented, the read pointers RPTR circulate proper values.

When the read pointers RPTR are reset, the data 'XX' (1120) of the flip-flop circuit 521-0 of the ring buffer 305 is read out at time T10 corresponding to the next rising edge of CLKIN (1109, 1118) and the read-out data is stored in a bit#0 (1136) of the reception register 314. Then, each time the read pointer RPTR is incremented, data is sequentially read out from the corresponding flip-flop circuit (1121 to 1135) of ring buffer 305 and the read-out data is written in the bit #0 of the reception register 314.

In this example, the latency since the data 'XX' is transmitted from the transmission apparatus 201 at time T7 until the data 'XX' is stored in the reception register 314 at time T10 becomes about 6.5 cycles. Therefore, the latency is improved only by 3 cycles in comparison with the case of the data 'HH' of FIG. 11. In other words, by delaying the reset momentum signal of a read pointer by only 13τ using the adjustment circuit 312, the read pointer can be operated while being traced back by 3 cycles by appearances so that the loss to be lost by the synchronization circuit 311 can be redeemed.

By the way, in the explained preferred embodiment, it is assumed that a relation between the transfer frequency of parallel data and the frequency of an internal clock signal CLKIN is a one-to-one relation and the underrun/overrun of the ring buffer 305 does not occur. In the case where the relation between these frequencies is 1:N, it is possible to prevent the underrun/overrun by setting the number of updating times of a read pointer to 1/N.

Figure 14:
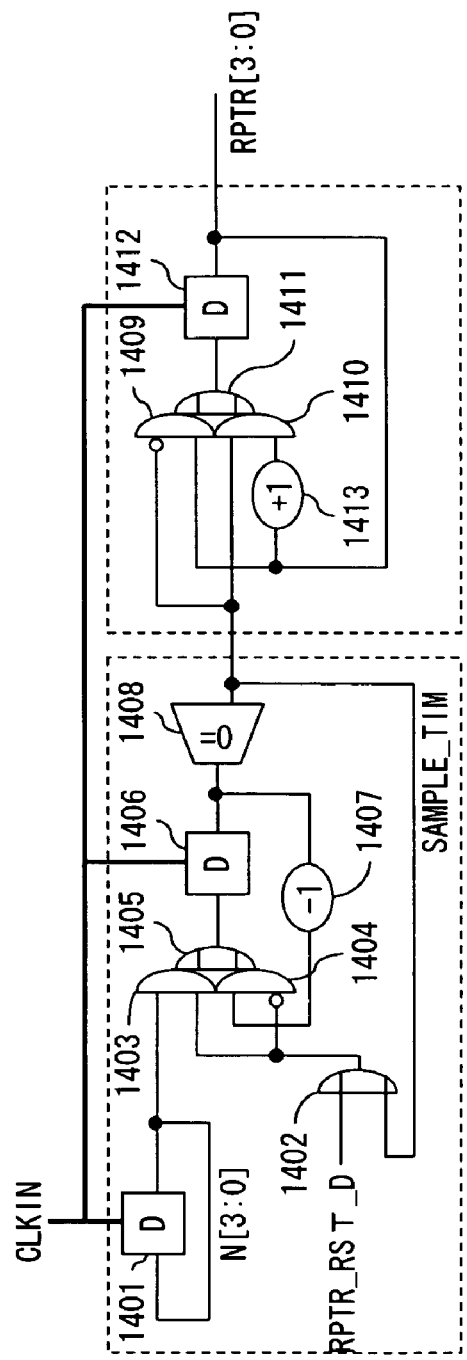
FIG. 14 shows the configuration of the second read pointer circuit.

FIG. 14 shows the configuration example of the read pointer circuit 313. The read pointer circuit of FIG. 14 comprises D flip-flop circuits 1401, 1406 and 1412, OR circuits 1402, 1405 and 1411, AND circuits 1403, 1404, 1409 and 1410, a subtraction circuit 1407, a detection circuit 1408 and an addition circuit 1413.

The flip-flop circuit 1401 can set one of 0 to 15 as a predetermined value using a signal N[3:0] of four bits. The thus-set predetermined value is smaller than a frequency division ratio N by 1 and N[3:0]=0, 1, 2, 3, . . . , 15 corresponds to N=1, 2, 3, 4, . . . , 16. The flip-flop circuit 1401 outputs to the AND circuit 1403 the value of N[3:0] that is set in accordance with a clock signal CLKIN.

The OR circuit 1402 outputs to the AND circuits 1403 and 1404 the logical sum of a signal RPTR_RST_D from the adjustment circuit 312 and an output signal SAMPLE_TIM from the detection circuit 1408.

The AND circuits 1403 and 1404, the OR circuit 1405, the flip-flop circuit 1406 and the subtraction circuit 1407 configure a down counter and operate in the same way as the down counter of FIG. 9, thereby outputting the signal indicating a counter value to the detection circuit 1408. The detection circuit 1408 detects the fact that the counter value becomes '0' and it outputs '1' as the signal SAMPLE_TIM.

The AND circuit 1409 outputs the logical product of a value obtained by inverting the signal SAMPLE_TIM and an output signal RPTR [3:0] of the flip-flop circuit 1412 while the addition circuit 1413 adds 1 to the value of RPTR [3:0] and outputs the obtained value to the AND circuit 1410. The AND circuit 1410 outputs the logical product of the signal SAMPLE_TIM and an output of the addition circuit 1413 while the OR circuit 1411 outputs the logical sum of an output of the AND circuit 1409 and an output of the AND circuit 1410. The flip-flop circuit 1412 latches an output of the OR circuit 1411 and outputs the latched output as RPTR [3:0], in accordance with the clock signal CLKIN.

According to such a read pointer circuit, when the signal RPTR_RST_D becomes '1', the predetermined value that is retained in the flip-flop circuit 1401 is loaded into the flip-flop circuit 1406 and then the signal RPTR_RST_D becomes '0', counting down is started. Since the signal SAMPLE_TIM remains '0' until the counting down ends, the read pointer is not updated so that the present value is retained. When the counting value becomes '0', '1' is outputted as the signal SAMPLE_TIM and the read pointer is updated. At the same time, the predetermined value is loaded into the flip-flop circuit 1406 again. Thereafter, the same operation is repeated and the read pointer is updated for each Nτ.

FIG. 15 shows the configuration example in which a function similar to the adjustment circuit 312 is added to the read pointer circuit of FIG. 14. In this configuration, since the reset value of a read pointer can be set to an optional value, the adjustment circuit 312 becomes unnecessary and an output signal RPTR_RST_SYNC of the synchronization circuit 311 is directly inputted into a read pointer circuit.

This read pointer circuit comprises D flip-flop circuits 1401, 1406, 1412 and 1502, OR circuits 1402, 1405 and 1506, AND circuits 1403, 1404, 1503, 1504 and 1505, the subtraction circuit 1407, the detection circuit 1408 and the addition circuit 1413. Among these circuits, the circuits with the same numbers as those of FIG. 14 operate in the same way as those circuits of FIG. 14.

The buffer 1501 outputs an inputted signal RPTR_RST_SYNC to the OR circuit 1402 as a signal RPTR_RST_D. The flip-flop circuit 1502 can set one of 0 to 15 as the initial value (reset value) of a reset pointer using a signal DEFAULT [3:0] of four bits. The flip-flop circuit 1502 outputs to the AND circuit 1505 the value of the thus-set DEFAULT [3:0] in accordance with a clock signal CLKIN.

The AND circuit 1503 outputs the logical product of the value obtained by inverting a signal SAMPLE_TIM, the value obtained by inverting the signal RPTR_RST_SYNC and an output signal RPTR [3:0] of the flip-flop circuit 1412. The AND circuit 1504 outputs the logical product of a value obtained by inverting the signal SAMPLE_TIM, a value obtained by inverting the signal RPTR_RST_SYNC and an output of the addition circuit 1413. The OR circuit 1506 outputs the logical sum of outputs of AND circuits 1503, 1504 and 1505. The flip-flop circuit 1412 latches an output of the OR circuit 1506 and outputs the latched output as RPTR [3:0], in accordance with a clock signal CLKIN.

Figure 16:
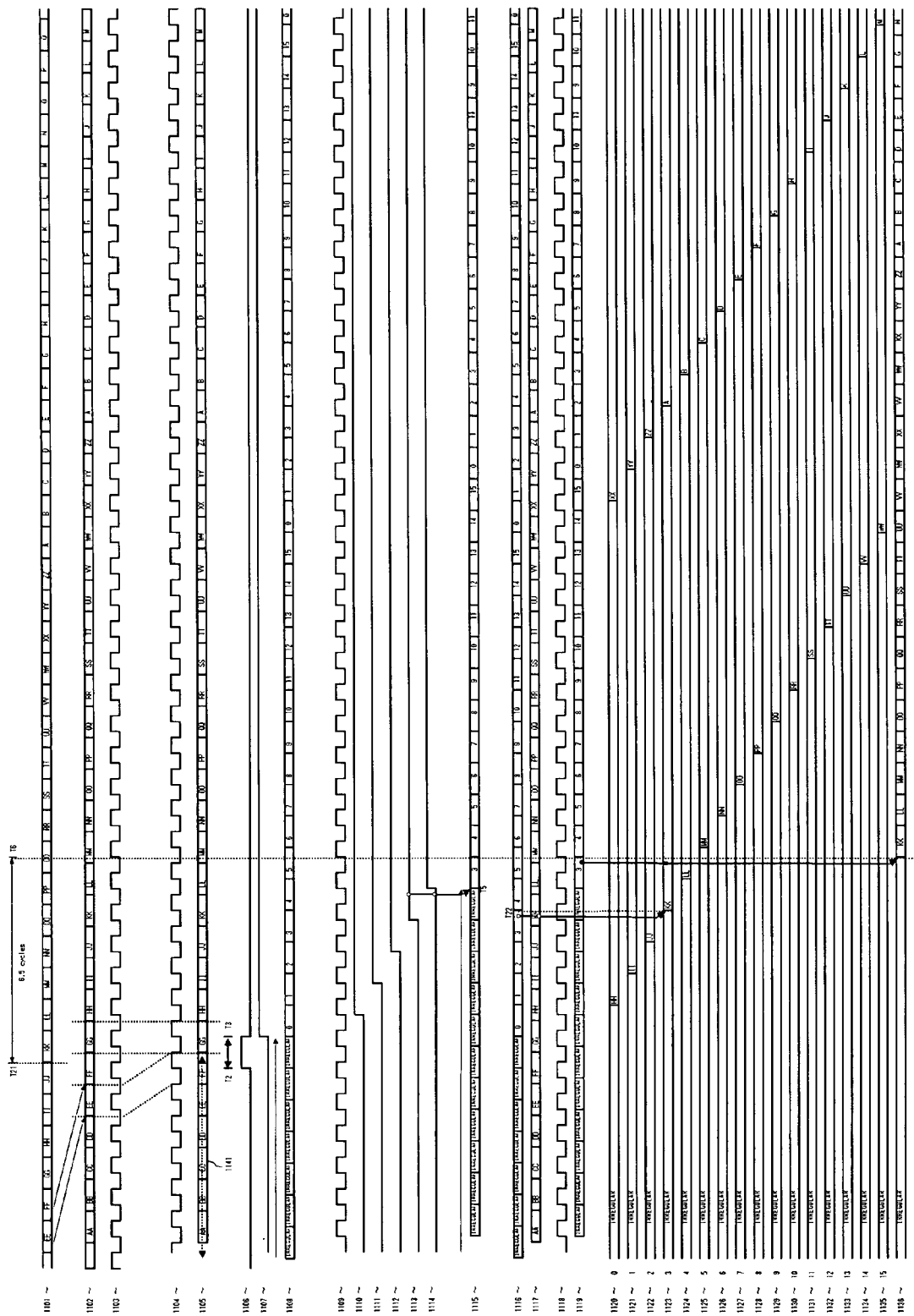
FIG. 16 is the third operation timing chart.

FIG. 16 is the timing chart that shows the operations in the case where a read pointer circuit of FIG. 15 is used. In this example, '0' is set as the value of N [3:0] (N=1) and '3' is set as the value of a signal DEFAULT [3:0]. 1101 to 1136 show the timings of the same signal or data as those of FIG. 11.

In this case, the operations until time T5 are identical to those of FIG. 11. The reception data 'KK' (1105, 1117) are written in the flip-flop circuit 521-3 (1123) of the ring buffer 305 at time T22 before time T5.

When an output signal RPTR_RST_SYNC of the synchronization circuit 311 becomes '1', the value of a signal N[3:0] is loaded into the flip-flop circuit 1406. Then, the value of the signal DEFAULT [3:0] is loaded into the flip-flop circuit 1412 at time T5 and the read pointers RPTR (1115, 1119) are reset to '3'. Until the reset is implemented, the read pointers RPTR circulate proper values.

When the read pointers RPTR are reset, data 'KK' (1123) of the flip-flop circuit 521-3 of the ring buffer 305 is read out at time T6 and the read-out data is stored in a bit #0 (1136) of the reception register 314. After that, each time the read pointers RPTR are incremented, data are sequentially read out from the corresponding flip-flop circuit (1124 to 1135, 1120 to 1122) of the ring buffer 305 and the read-out data are written in a bit #0 of the reception register 314.

In this example, the latency since data 'KK' is transmitted from the transmission apparatus 201 at time T21 until the data 'KK' is stored in the reception register 314 at time T6 becomes about 6.5 cycles. Therefore, the latency identical to the case of the data 'XX' of FIG. 13 is materialized even if the adjustment circuit 312 is not provided.

In the reception apparatus 202 shown in FIG. 3, the clock adjustment circuit 302 is provided for each bit of parallel data. It is possible, however, to provide the clock adjustment circuits 302 for each group by dividing all the bits into several groups.

FIG. 17 shows the configuration example of a reception apparatus in the case where the parallel data is divided into the groups, every four bits. In FIG. 17, the circuit with the same number as that of FIG. 3 has the same configuration and function as that of FIG. 3. The reception apparatus 1701 of FIG. 17 comprises the PLL221, the input buffer 301, m data retention circuits 1702-k (k=0, 1, . . . , m−2, m−1) and the reception circuit 223.

The data retention circuit 1702-0 comprises a group clock adjustment circuit 1703 and four bit data retention circuits 1704-p (p=0, 1, 2, 3). The group clock adjustment circuit 1703 comprises the clock adjustment circuit 302, the write pointer reset timing detection circuit 303 and the write pointer circuit 304. Each bit data retention circuit 1704-p comprises the ring buffer 305.

From among n data signal it#0 to it#n outputted from the input buffer 301, four data signals it#0 to it#3 are inputted into the data retention circuit 1702-0. The data signal it#0 is inputted into the group clock adjustment circuit 1703 and the bit data retention circuit 1704-0. The data signals it#1 to it#3 are inputted into bit data retention circuits 1704-1 to 1704-3, respectively.

The group clock adjustment circuit 1703 generates both an adjustment clock signal iclk#0 and a signal rst-tim#0 from the data signal it#0 in the same way as the case of FIG. 3. The ring buffer 305 of the four bit data retention circuits 1704-0 to 1704-3 operate in accordance with all the same adjustment clock signals iclk#0.

The configuration and operation of other data retention circuits 1702 are identical to those of the data retention circuit 1702-0. In this example, however, the output signals of the data retention circuits 1702-1 to 1702-(m−1) are not connected to the synchronization circuit 311.

On the other hand, if the synchronization circuit similar to that of FIG. 8 is used, the circuit can wait for two or more signals rst-tim#i (i=0, 4, 8, . . . ) that are outputted from the write pointer reset timing detection circuits of two or more groups.

According to the reception apparatus 1701, the hardware of the clock adjustment circuit 302, etc. can be substantially reduced in comparison with the reception apparatus 202 of FIG. 3. Furthermore, the number of bits for each group is optional and accordingly it is not limited to four bits.

What is claimed is:

1. A data reception apparatus for receiving a first parallel data of a plurality of bits, comprising:
 a plurality of clock adjustment devices, the number of clock adjustment devices being equal to a number of bits of the first parallel data, each of the clock adjustment devices adjusting a first clock signal using a data signal of each bit of the first parallel data, the data signal being different from the first clock signal, and generating an adjustment clock signal in such a way that a set-up time and a hold time of the data signal are secured for each bit of the first parallel data;
 a plurality of data buffer devices, the number of data buffer devices being equal to a number of bits of the first parallel data, each of the data buffer devices fetching the data signal of each bit and retaining a fixed number of data for each bit in chronological order, in accordance with the adjustment clock signal;

a read device selecting data of a plurality of bits in the data buffer devices in chronological order and reading out the selected data as a second parallel data, in accordance with a second clock signal, each bit of the selected data being selected from each of the data buffer devices; and a storage device storing the second parallel data.

2. The data reception apparatus according to claim 1, further comprising:

a detection device, a write pointer device and a write device, wherein:

each of the data buffer devices includes the fixed number of buffer devices which retain the fixed number of data in chronological order;

the detection device detects a reception of predetermined time-series data and outputs a detection signal;

the write pointer device stores write pointer information which indicates a buffer device in which data is to be stored next from among the fixed number of buffer devices, sets the write pointer information to a predetermined value when the detection signal is outputted from the detection device and updates the write pointer information in such a way that the fixed number of buffer devices are selected in predetermined order; and the write device inputs a data signal into the buffer device which is indicated by the write pointer information.

3. The data reception apparatus according to claim 1, further comprising:

a detection device and a synchronization device, wherein each of the data buffer devices includes the fixed number of buffer devices which retain the fixed number of data in chronological order;

the read device includes a read pointer device;

the detection device detects a reception of predetermined time-series data and outputs a detection signal;

the synchronization device synchronizes the detection signal with the second clock signal and generates a synchronization signal; and the read pointer device operates in accordance with the second clock signal, stores read pointer information which indicates a buffer device in which data to be read out next is retained from among the fixed number of buffer devices, sets the read pointer information to a predetermined value when the synchronization signal is outputted from the synchronization device and updates the read pointer information in such a way that the fixed number of buffer devices are selected in predetermined order.

4. The data reception apparatus according to claim 3, wherein when receptions of time-series data of a plurality of bits are respectively detected and a plurality of detection signals are respectively outputted, the synchronization device synchronizes a logical product of the plurality of detection signals with the second clock signal and generates a synchronization signal.

5. The data reception apparatus according to claim 3, further comprising:

an adjustment device delaying the synchronization signal only by a predetermined number of clocks, wherein the read pointer device sets the read pointer information to the predetermined value when the synchronization signal is outputted from the adjustment device.

6. The data reception apparatus according to claim 5, wherein the adjustment device retains information selected from a plurality of pieces of information respectively designating a plurality of clock numbers and delays the synchronization signal in accordance with the retained information.

7. The data reception apparatus according to claim 3, wherein when a relation between a transfer frequency of the parallel data and a frequency of the second clock signal is 1:N, the read pointer device updates the read pointer information at a frequency of once every N cycles of the second clock signal.

8. The data reception apparatus according to claim 3, further comprising:

a write pointer device storing write pointer information which indicates a buffer device in which data is to be stored next from among the fixed number of buffer devices, setting the write pointer information to a predetermined value when the detection signal is outputted from the detection device and updating the write pointer information in such a way that the fixed number of buffer devices are selected in predetermined order; and a write device inputting a data signal into a buffer device which is indicated by the pointer information.

9. A data reception apparatus for receiving a first parallel data of a plurality of bits, comprising:

a plurality of clock adjustment devices, the number of clock adjustment devices being equal to a number of a plurality of groups, each of the groups including two or more bits of the first parallel data, each of the clock adjustment devices adjusting a first clock signal using a data signal of a bit in each group, the data signal being different from the first clock signal, and generating an adjustment clock signal in such a way that a set-up time and a hold time of a data signal are secured for each group;

a plurality of data buffer devices, the number of data buffer devices being equal to a number of bits of the first parallel data, each of the data buffer devices fetching a data signal of each bit in each group and retaining a fixed number of data for each bit in chronological order, in accordance with the adjustment clock signal of each group;

a read device selecting data of a plurality of bits in the data buffer devices in chronological order and reading out the selected data as second parallel data, in accordance with a second clock signal, each bit of the selected data being selected from each of the data buffer devices; and a storage device storing the second parallel data.

10. A data reception method of receiving a first parallel data of a plurality of bits, comprising:

adjusting a first clock signal by a plurality of clock adjustment devices, the number of clock adjustment devices being equal to a number of bits of the first parallel data, each of the clock adjustment devices adjusting the first clock signal using a data signal of each bit of the first parallel data, the data signal being different from the first clock signal, and generating an adjustment clock signal in such a way that a set-up time and a hold time of the data signal are secured for each bit of the first parallel data;

fetching the data signal of each bit in each of a plurality of data buffer devices in accordance with the adjustment clock signal, the number of data buffer devices being equal to a number of bits of the first parallel data, each of the data buffer devices retaining a fixed number of data for each bit in chronological order;

selecting data of a plurality of bits in the data buffer devices in chronological order and reading out the selected data as a second parallel data, in accordance with a second clock signal, each bit of the selected data being selected from each of the data buffer devices; and storing the second parallel data in a storage device.

11. A data reception method of receiving a first parallel data of a plurality of bits, comprising:

adjusting a first clock signal by a plurality of clock adjustment devices, the number of clock adjustment devices being equal to a number of a plurality of groups, each of the groups including two or more bits of the first parallel data, each of the clock adjustment devices adjusting the first clock signal using a data signal of a bit in each group, the data signal being different from the first clock signal, and generating an adjustment clock signal in such a way that a set-up time and a hold time of a data signal are secured for each group;

fetching a data signal of each bit in each group in each of a plurality of data buffer devices in accordance with the adjustment clock signal of each group, the number of data buffer devices being equal to a number of bits of the first parallel data, each of the data buffer devices retaining a fixed number of data for each bit in chronological order;

selecting data of a plurality of bits in the data buffer devices in chronological order and reading out the selected data as a second parallel data, in accordance with a second clock signal, each bit of the selected data being selected from each of the data buffer devices; and storing the second parallel data in a storage device.

12. A data reception apparatus for receiving a first parallel data of a plurality of bits, comprising:

a plurality of clock adjustment means, the number of clock adjustment means being equal to a number of bits of the first parallel data, each of the clock adjustment means for adjusting a first clock signal using a data signal of each bit of the first parallel data, the data signal being different from the first clock signal, and for generating an adjustment clock signal in such a way that a set-up time and a hold time of the data signal are secured for each bit of the first parallel data;

a plurality of data buffer means, the number of data buffer means being equal to a number of bits of the first parallel data, each of the data buffer means for fetching the data signal of each bit and retaining a fixed number of data for each bit in chronological order, in accordance with the adjustment clock signal;

read means for selecting data of a plurality of bits in the data buffer means in chronological order and reading out the selected data as a second parallel data, in accordance with a second clock signal, each bit of the selected data being selected from each of the data buffer means; and storage means for storing the second parallel data.

13. A data reception apparatus for receiving parallel data of a plurality of bits, comprising:

a plurality of clock adjustment means, the number of clock adjustment means being equal to a number of a plurality of groups, each of the groups including two or more bits of the first parallel data, each of the clock adjustment means for adjusting a first clock signal using a data signal of a bit in each group, the data signal being different from the first clock signal, and for generating an adjustment clock signal in such a way that a set-up time and a hold time of a data signal are secured for each group;

a plurality of data buffer means, the number of data buffer means being equal to a number of bits of the first parallel data, each of the data buffer means for fetching a data signal of each bit in each group and retaining a fixed number of data for each bit in chronological order, in accordance the adjustment clock signal of each group;

read means for selecting data of a plurality of bits in the data buffer means in chronological order and reading out the selected data as a second parallel data, in accordance with a second clock signal, each bit of the selected data being selected from each of the data buffer means; and storage means for storing the second parallel data.

* * * * *